United States Patent
Cho et al.

(10) Patent No.: US 9,312,213 B2
(45) Date of Patent: Apr. 12, 2016

(54) BUMP STRUCTURES HAVING AN EXTENSION

(71) Applicants: Moon Gi Cho, Suwon-si (KR); Young Lyong Kim, Gunpo-si (KR); Sun-Hee Park, Seoul (KR); Hwan-Sik Lim, Gunpo-si (KR)

(72) Inventors: Moon Gi Cho, Suwon-si (KR); Young Lyong Kim, Gunpo-si (KR); Sun-Hee Park, Seoul (KR); Hwan-Sik Lim, Gunpo-si (KR)

(73) Assignee: SAMSUNG ELECTRONICS CO., LTD. (KR)

( * ) Notice: Subject to any disclaimer, the term of this patent is extended or adjusted under 35 U.S.C. 154(b) by 0 days.

(21) Appl. No.: 14/014,300

(22) Filed: Aug. 29, 2013

(65) Prior Publication Data

US 2014/0084457 A1    Mar. 27, 2014

(30) Foreign Application Priority Data

Sep. 25, 2012  (KR) .................. 10-2012-0106710

(51) Int. Cl.
  *H01L 23/48*  (2006.01)
  *H01L 23/498*  (2006.01)
  *H01L 23/00*  (2006.01)

(52) U.S. Cl.
  CPC .......... *H01L 23/49811* (2013.01); *H01L 24/05* (2013.01); *H01L 24/11* (2013.01); *H01L 24/13* (2013.01); *H01L 24/14* (2013.01); *H01L 23/49838* (2013.01); *H01L 24/16* (2013.01); *H01L 24/81* (2013.01); *H01L 2224/02331* (2013.01); *H01L 2224/02351* (2013.01); *H01L 2224/02372* (2013.01); *H01L 2224/0345* (2013.01); *H01L 2224/0381* (2013.01); *H01L 2224/0401* (2013.01); *H01L 2224/05022* (2013.01); *H01L 2224/05025* (2013.01); *H01L 2224/0556* (2013.01); *H01L 2224/05166* (2013.01); *H01L 2224/05548* (2013.01); *H01L 2224/05572* (2013.01); *H01L 2224/05624* (2013.01); *H01L 2224/05647* (2013.01); *H01L 2224/06181* (2013.01); *H01L 2224/10165* (2013.01); *H01L 2224/10175* (2013.01); *H01L 2224/1147* (2013.01); *H01L 2224/11462* (2013.01); *H01L 2224/11849* (2013.01); *H01L 2224/13008* (2013.01); *H01L 2224/13015* (2013.01); *H01L 2224/13017* (2013.01); *H01L 2224/13027* (2013.01); *H01L 2224/13082* (2013.01); *H01L 2224/13111* (2013.01); *H01L 2224/13113* (2013.01); *H01L 2224/13124* (2013.01); *H01L 2224/13147* (2013.01);
(Continued)

(58) Field of Classification Search
  CPC ... H01L 24/11; H01L 24/13; H01L 23/49811; H01L 2924/15311; H01L 2225/06513; H01L 2225/06517
  USPC .................. 257/737, 738, 690, 692, 777, 778
  See application file for complete search history.

(56) References Cited

U.S. PATENT DOCUMENTS

| 5,892,179 A | 4/1999 | Rinne et al. |
| 5,902,686 A | 5/1999 | Mis |

(Continued)

FOREIGN PATENT DOCUMENTS

KR    20120128967 A    11/2012

*Primary Examiner* — Hung Vu
(74) *Attorney, Agent, or Firm* — Renaissance IP Law Group LLP

(57) ABSTRACT

A bump structure may include a body portion spaced apart from a pad disposed on a substrate and a first extension extending from a side of the body portion onto the pad. A second extension extends from another side of the body portion.

31 Claims, 20 Drawing Sheets

(52) U.S. Cl.
CPC ............. *H01L2224/13164* (2013.01); *H01L 2224/14133* (2013.01); *H01L 2224/16105* (2013.01); *H01L 2224/16145* (2013.01); *H01L 2224/16235* (2013.01); *H01L 2224/16238* (2013.01); *H01L 2224/81191* (2013.01); *H01L 2225/06513* (2013.01); *H01L 2225/06517* (2013.01); *H01L 2924/00014* (2013.01); *H01L 2924/15311* (2013.01); *H01L 2924/181* (2013.01)

(56) References Cited

U.S. PATENT DOCUMENTS

| | | | |
|---|---|---|---|
| 6,388,203 B1* | 5/2002 | Rinne et al. | 174/261 |
| 6,818,545 B2* | 11/2004 | Lee et al. | 438/614 |
| 7,538,430 B2 | 5/2009 | Yoshioka et al. | |
| 7,674,701 B2 | 3/2010 | Rinne | |
| 7,906,421 B2 | 3/2011 | Trovarelli et al. | |
| 2004/0009630 A1* | 1/2004 | Andoh | 438/122 |
| 2007/0052095 A1 | 3/2007 | Torii et al. | |
| 2007/0075440 A1* | 4/2007 | Osanai et al. | 257/786 |
| 2007/0184643 A1 | 8/2007 | Rinne | |
| 2007/0298602 A1 | 12/2007 | Trovarelli et al. | |
| 2008/0093749 A1* | 4/2008 | Gerber et al. | 257/784 |
| 2008/0099915 A1 | 5/2008 | Yoshioka et al. | |
| 2009/0200664 A1* | 8/2009 | Migita et al. | 257/737 |
| 2010/0207271 A1 | 8/2010 | Omi | |
| 2010/0258335 A1* | 10/2010 | Arvin et al. | 174/126.2 |
| 2011/0067911 A1 | 3/2011 | Ishikawa et al. | |
| 2012/0043654 A1 | 2/2012 | Lu et al. | |
| 2012/0098120 A1 | 4/2012 | Yu et al. | |
| 2012/0295434 A1 | 11/2012 | Cho et al. | |

\* cited by examiner

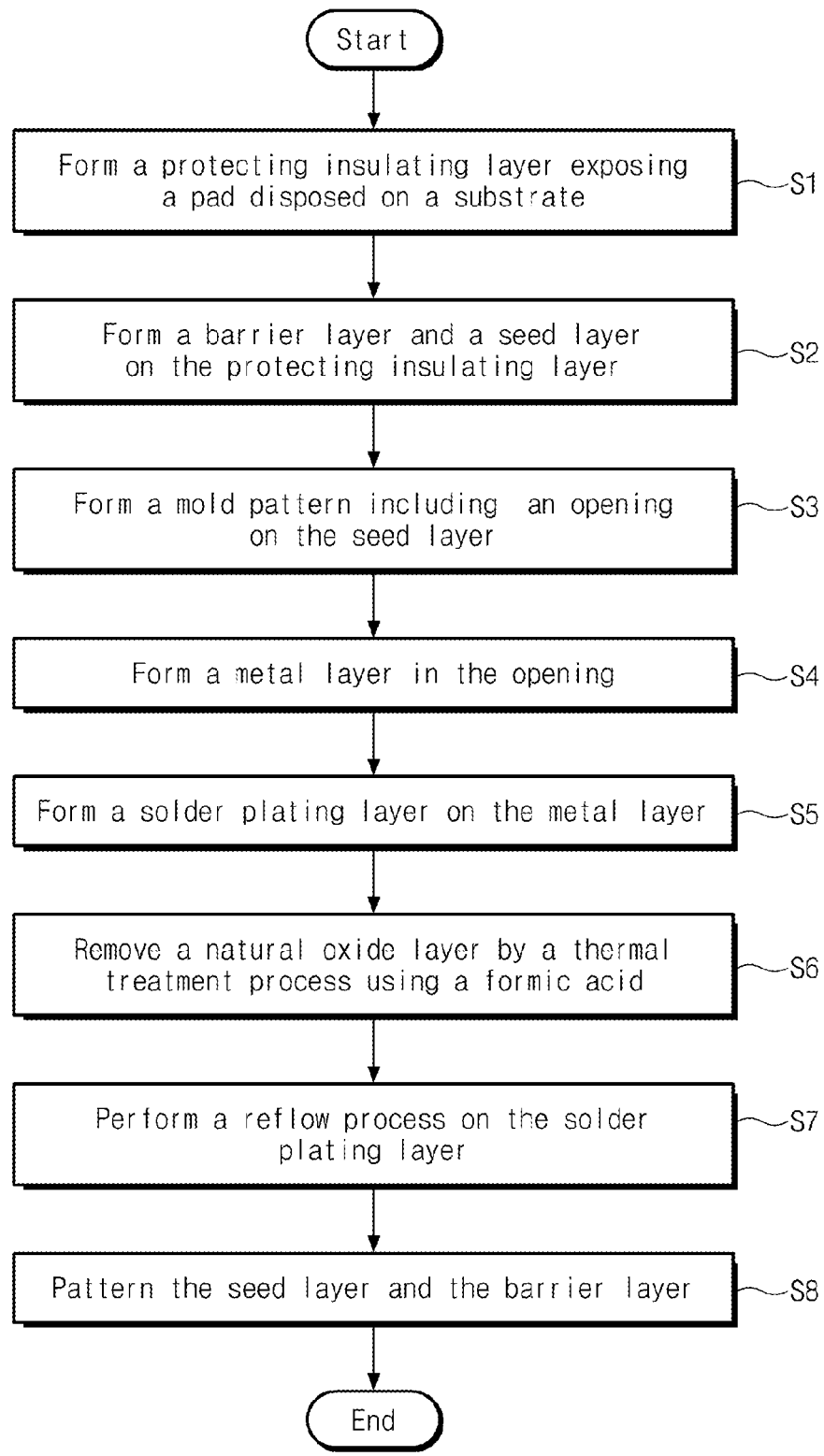

Fig. 6A
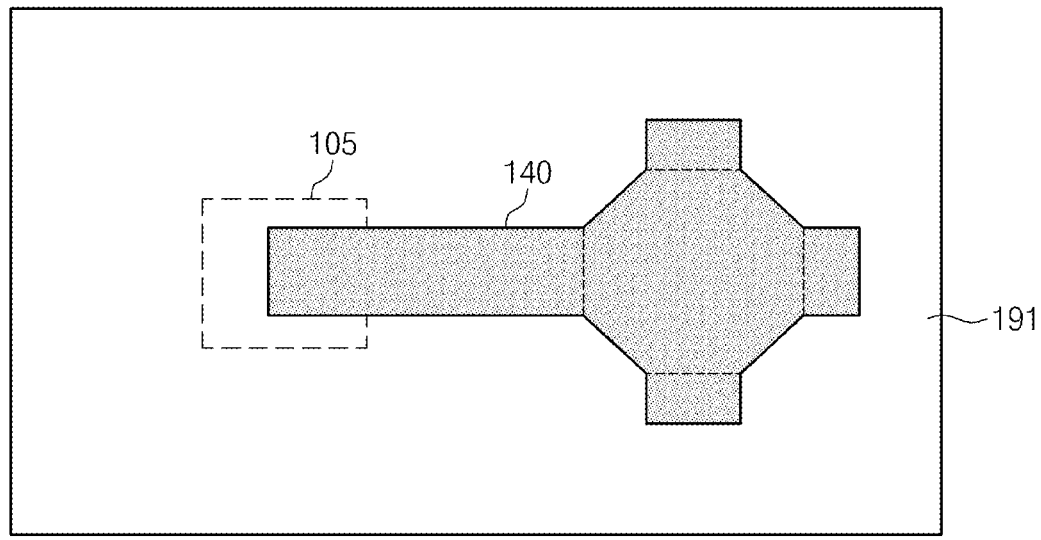
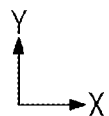
Fig. 6B
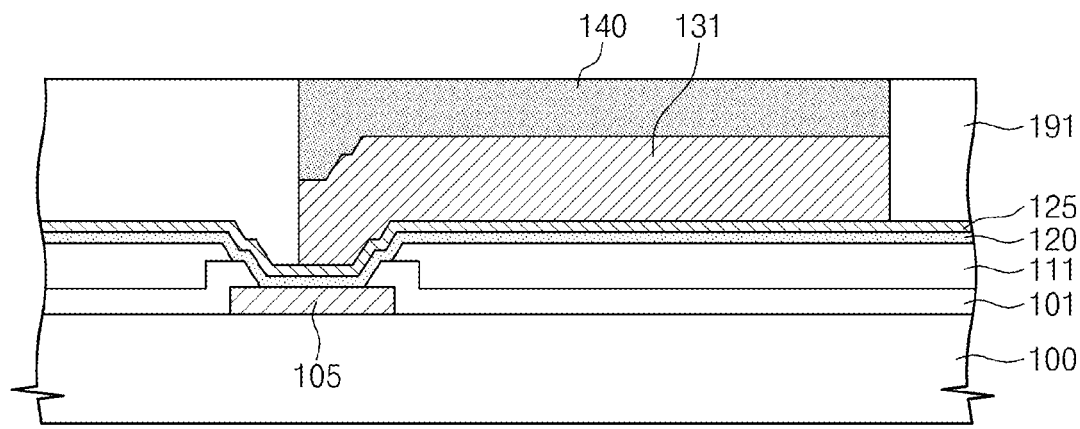
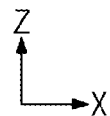

BUMP STRUCTURES HAVING AN EXTENSION

CROSS-REFERENCE TO RELATED APPLICATIONS

This U.S. non-provisional patent application claims priority under 35 U.S.C. §119 to Korean Patent Application No. 10-2012-0106710, filed on Sep. 25, 2012, the entirety of which is incorporated by reference herein.

BACKGROUND

The inventive concept relates to a semiconductor device including a bump structure and a method of forming the same.

In the semiconductor industry, various packaging technologies have been introduced to meet the rapidly increasing demands for high capacity, ultra-thin, and smaller semiconductor devices and electronic products using the semiconductor device. A multi-chip package includes vertically stacked semiconductor chips. Using multi-chip packaging techniques, semiconductor chips having various functions are formed in a smaller area than a general package consisting of a single semiconductor chip.

Semiconductor packages having many input/output (I/O) pins, excellent electrical characteristics, and low manufacture costs have been increasingly demanded with high speed, high integration, and/or multi-function of semiconductor devices. A flip chip package technique is one of packaging techniques for achieving the demands. Generally, a semiconductor chip of the flip chip package has chip pads connected to bumps and is mounted in a face down manner on a printed circuit board. However, mechanical durability and/or electrical characteristics of the flip chip package may be deteriorated by positions of the chip pads of the flip chip package, such that reliability of the flip chip package may be deteriorated. These problems may also occur in other semiconductor packages having a chip stacking structure and/or a package stacking structure.

SUMMARY

Embodiments of the inventive concept may provide structures capable of electrically connecting substrates to each other with ease.

Embodiments of the inventive concept may also provide structures capable of improving reliability of a semiconductor device.

Embodiments of the inventive concept may provide structures capable of reducing a distance between pads of a semiconductor device.

In one aspect, a bump structure may include: a body portion provided on a substrate and spaced apart from a pad disposed on the substrate; a first extension extending from a side of the body portion onto the pad; and a second extension extending from another side of the body portion. A width of the first extension may be smaller than a width of the body portion.

In an embodiment, the bump structure may include a barrier layer, a metal layer, and a solder layer sequentially stacked on the substrate. A portion of the solder layer in the body portion may be thicker than another portion of the solder layer in the first extension.

In an embodiment, a thickness of the solder layer may increase from a location near the pad toward the body portion.

In an embodiment, a thickness of the solder layer may decreases from the body portion toward an end portion of the second extension.

In an embodiment, the thickest portion of the solder layer may be provided in the body portion.

In an embodiment, a length of the second extension may be smaller than a length of the first extension.

In an embodiment, a width of the first extension may have a range of about 10% to about 90% of a width of the body portion.

In an embodiment, a length of the first extension may be greater than a length of the body portion.

In an embodiment, the second extension may include a plurality of second extensions; and at least one of the plurality of second extensions has a length different from a length of another of plurality of second extensions.

In an embodiment, the first extension may extend in a first direction. The bump structure may further include: third extensions extending from the first extension in a second direction crossing the first direction.

In an embodiment, the third extensions may be provided on both sides of the first extension.

In another aspect, a bump structure may include: a body portion provided on a substrate and spaced apart from a pad disposed on the substrate; and a first extension extending from a side of the body portion to the pad. The body portion and the first extension may include a barrier layer, a metal layer, and a solder layer which are sequentially stacked on the substrate. A thickness of the metal layer may be three or more times greater than a thickness of the barrier layer. A top surface of the body portion may be higher than a top surface of the first extension.

In an embodiment, the first extension may extend in a first direction; and a width of the first extension may be smaller than a width of the body portion in a second direction substantially perpendicular to the first direction in plan view.

In an embodiment, the width of the first extension may have a range of about 10% to about 90% of the width of the body portion.

In an embodiment, a length of the first extension may be greater than a length of the body portion.

In an embodiment, a thickness of the solder layer in the body portion may be greater than a thickness of the solder layer in the first extension.

In an embodiment, the thickness of the solder layer in the body portion may be about 1.5 or more times greater than the thickness of the solder layer in the first extension.

In an embodiment, the thickness of the solder layer may increase along the first extension to the body portion.

In an embodiment, the bump structure may further include: a metal-solder compound layer disposed between the metal layer and the solder layer.

In an embodiment, the bump structure may further include: a protecting insulating layer disposed between the substrate and the barrier layer. The protecting insulating layer may expose a top surface of the pad.

In an embodiment, a sidewall of the metal layer and a sidewall of the barrier layer may include an undercut region laterally recessed from an outer boundary of the solder layer.

In an embodiment, the bump structure may further include: a second extension extending from another side of the body portion. The top surface of the body portion may be higher than a top surface of the second extension.

In an embodiment, the second extension may be shorter in length than the first extension.

In still another aspect, an electrical connection structure may include: first pads on a first substrate; bump structures connected to the first pads; and second pads on a second substrate, the second pads electrically connected to the first pads through the bump structures. Each of the bump structures may include: a body portion laterally spaced apart from the first pad and connected to the second pad; a first extension extending from a side of the body portion onto the first pad; and a second extension extending from another side of the body portion. The body portion may be thicker than the first extension.

In an embodiment, each of the bump structures may include a barrier layer, a metal layer, and a solder layer sequentially stacked on the first substrate; and the thickest portion of the solder layer may be disposed in the body portion.

In an embodiment, the solder layer in the first extension may become thicker toward the body portion.

In an embodiment, the first extension may extend in a first direction; and a width of the first extension may be smaller than a width of the body portion in a second direction perpendicular to the first direction in plan view.

In an embodiment, the width of the first extension may have a range of about 10% to about 90% of the width of the body portion.

In an embodiment, the first pads may be arranged in one direction. In this case, the bump structures connected to odd-numbered pads of the first pads arranged in the one direction may be disposed at a side of the first pads; and the bump structures connected to even-numbered pads of the first pads arranged in the one direction may be disposed at another side of the first pads.

In one embodiment, the first pads are arranged along the first substrate in a first direction in plan view. In addition, the bump structures comprise a first group of bump structures and a second group of bump structures. The first group of bump structures is connected to odd-numbered ones of the first pads, and the second group of bump structures is connected to even-numbered ones of the first pads, respectively. The first group of bump structures extends along a second direction in plan view and is disposed on a first side of the first pads. The second group of bump structures extends along the second direction and is disposed on an opposite side of the first pads.

In an embodiment, the electrical connection structure may further include: an insulating pattern disposed on the second substrate and vertically overlapping the first extension.

In an embodiment, the insulating pattern may extend in the one direction.

In an embodiment, the body portion of each of the bump structures may be aligned with each of the second pads.

In yet another aspect, a method of forming an electrical connection structure may include: forming a pad on a substrate; forming a bather layer on the pad; forming a mold pattern including an opening on the barrier layer; sequentially forming a metal layer and a solder plating layer in the opening; and reflowing the solder plating layer. The opening may include: a first portion extending from the pad in a first direction; and a second portion having a width greater than a width of the first portion.

In an embodiment, the opening may further include: a third portion extending from the second portion. The third portion may be shorter in length than the first portion.

In an embodiment, a portion of the solder plating layer in the first portion may migrate to the second portion by a surface tension when the solder plating layer is reflowed.

In an embodiment, the method may further include: etching the barrier layer using a solder layer formed by the reflowing the solder plating layer as an etch mask.

In an embodiment, the method may further include: forming a seed layer between the barrier layer and the metal layer. The seed layer may include the same material as the metal layer.

In an embodiment, the seed layer may be etched together with the barrier layer when the barrier layer is etched.

In an embodiment, the method may further include: removing a natural oxide layer formed on the seed layer before reflowing the solder plating layer. The natural oxide layer may be removed by a thermal treatment process using a formic acid ($HCO_2H$).

In an embodiment, etching the barrier layer may include: performing a wet etching process. An undercut region may be formed on a sidewall of the metal layer and/or a sidewall of the barrier layer when the wet etching process is performed.

In some embodiments, a semiconductor package comprises a semiconductor chip having a chip pad; and a bump structure. The bump structure includes: a metal layer pattern onto the chip pad; and a solder plating layer disposed on the metal layer pattern. The solder plating layer includes a bonding portion protruded therefrom to be coupled to a substrate. A center of the chip pad is spaced apart from a center of the bonding portion of the solder plating layer.

In some embodiments, the bump structure may have an asymmetric shape along its central axis.

In some embodiments, a semiconductor package includes a semiconductor chip having a chip pad; and a bump structure onto the chip pad. The bump structure may include a redistribution layer coupled to the chip pad and extending past an edge of the chip pad; and a solder plating layer arranged over the redistribution layer. The solder layer has a protruding portion located in a region spaced apart from the chip pad.

In some embodiments, the semiconductor chip comprises a passivation layer having an opening exposing the chip pad, and the redistribution layer of the bump structure is disposed above a topmost surface of the passivation layer.

BRIEF DESCRIPTION OF THE DRAWINGS

The inventive concept will become more apparent in view of the attached drawings and accompanying detailed description.

FIG. 2 is a flowchart illustrating a method of forming a bump structure according to an example embodiment of the inventive concept;

FIGS. 3A to 7A are plan views illustrating a method of forming a bump structure according to an example embodiment of the inventive concept;

FIGS. 3B to 7B are cross-sectional views illustrating a method of forming a bump structure according to an example embodiment of the inventive concept;

DETAILED DESCRIPTION OF THE EMBODIMENTS

Figure 1A:
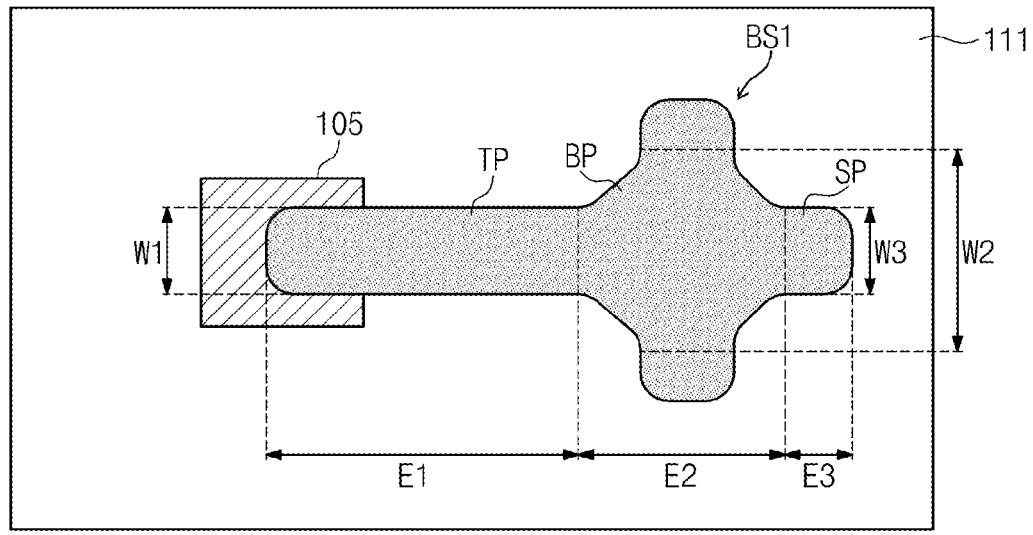
FIG. 1A is a plan view illustrating a bump structure according to an example embodiment of the inventive concept.

The inventive concept will now be described more fully hereinafter with reference to the accompanying drawings, in which exemplary embodiments of the inventive concept are shown. The advantages and features of the inventive concept and methods of achieving them will be apparent from the following exemplary embodiments that will be described in more detail with reference to the accompanying drawings. It should be noted, however, that the inventive concept is not limited to the following exemplary embodiments, and may be implemented in various forms. Accordingly, the exemplary embodiments are provided only to disclose the inventive concept and let those skilled in the art know the category of the inventive concept. In the drawings, embodiments of the inventive concept are not limited to the specific examples provided herein and are exaggerated for clarity.

The terminology used herein is for the purpose of describing particular embodiments only and is not intended to limit the invention. As used herein, the singular terms "a," "an" and "the" are intended to include the plural forms as well, unless the context clearly indicates otherwise. As used herein, the term "and/or" includes any and all combinations of one or more of the associated listed items. It will be understood that when an element is referred to as being "connected" or "coupled" to another element, it may be directly connected or coupled to the other element or intervening elements may be present.

Similarly, it will be understood that when an element such as a layer, region or substrate is referred to as being "on" another element, it can be directly on the other element or intervening elements may be present. In contrast, the term "directly" means that there are no intervening elements. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

Additionally, the embodiment in the detailed description will be described with sectional views as ideal exemplary views of the inventive concept. Accordingly, shapes of the exemplary views may be modified according to manufacturing techniques and/or allowable errors. Therefore, the embodiments of the inventive concept are not limited to the specific shape illustrated in the exemplary views, but may include other shapes that may be created according to manufacturing processes. Areas exemplified in the drawings have general properties, and are used to illustrate specific shapes of elements. Thus, this should not be construed as limited to the scope of the inventive concept.

It will be also understood that although the terms first, second, third etc. may be used herein to describe various elements, these elements should not be limited by these terms. These terms are only used to distinguish one element from another element. Thus, a first element in some embodiments could be termed a second element in other embodiments without departing from the teachings of the present invention. Exemplary embodiments of aspects of the present inventive concept explained and illustrated herein include their complementary counterparts. The same reference numerals or the same reference designators denote the same elements throughout the specification.

Moreover, exemplary embodiments are described herein with reference to cross-sectional illustrations and/or plane illustrations that are idealized exemplary illustrations. Accordingly, variations from the shapes of the illustrations as a result, for example, of manufacturing techniques and/or tolerances, are to be expected. Thus, exemplary embodiments should not be construed as limited to the shapes of regions illustrated herein but are to include deviations in shapes that result, for example, from manufacturing. For example, an etching region illustrated as a rectangle will, typically, have rounded or curved features. Thus, the regions illustrated in the figures are schematic in nature and their shapes are not intended to illustrate the actual shape of a region of a device and are not intended to limit the scope of example embodiments.

[Bump Structure]

Figure 1B:
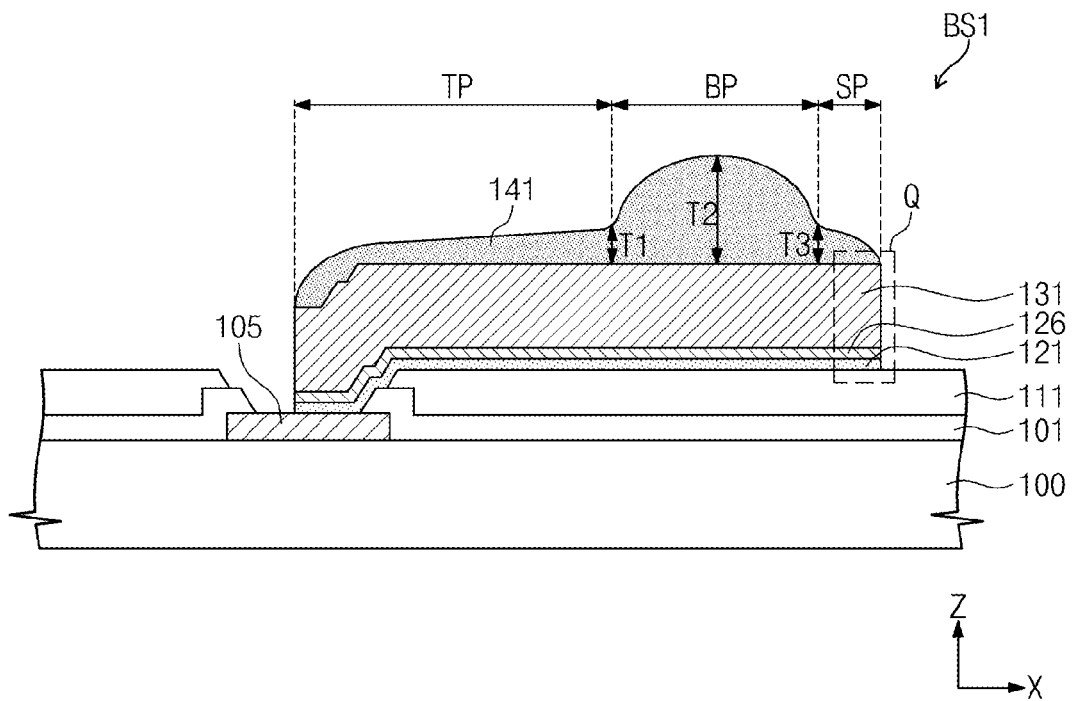
FIG. 1B is a cross-sectional view illustrating a bump structure according to an example embodiment of the inventive concept.
Figure 1C:
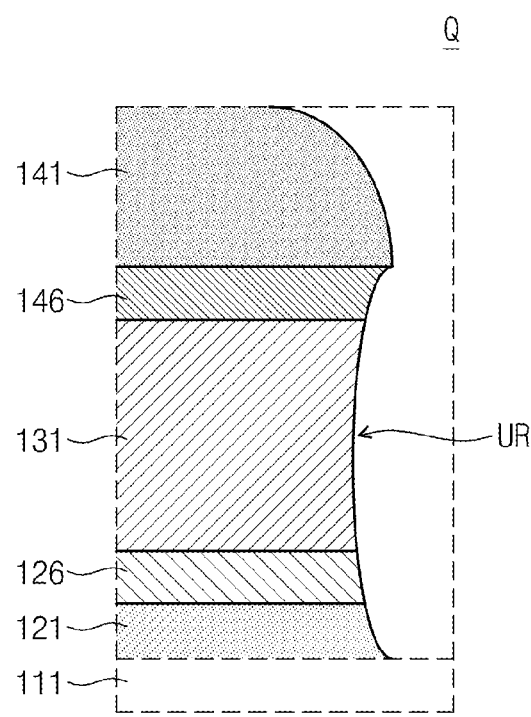
FIG. 1C is an enlarged view of a region 'Q' of FIG. 1B.

FIG. 1A is a plan view illustrating a bump structure according to an example embodiment of the inventive concept. FIG. 1B is a cross-sectional view illustrating a bump structure according to an example embodiment of the inventive concept. FIG. 1C is an enlarged view of a region 'Q' of FIG. 1B.

Referring to FIGS. 1A, 1B, and 1C, a first pad (or chip pad) 105 may be provided on a first substrate 100. The first substrate 100 may include a semiconductor based structure. For example, the first substrate 100 may include a silicon substrate or a silicon-on-insulator (SOI) substrate. The first substrate 100 may include at least one integrated circuit (not shown). For example, the first substrate 100 may include at least one of a memory device, a system LSI device such as a micro controller, a logic device, an analog device, a digital signal processor device, or a system on chip (SOC).

In an embodiment, the first pad 105 may be electrically connected to the integrated circuit (not shown) formed in the first substrate 100. For example, the first pad 105 may include a metal such as aluminum (Al), copper (Cu), silver (Ag), or gold (Au). A shape of the first pad 105 is not limited to the quadrilateral shape illustrated in FIG. 1A. The shape of the first pad 105 may be modified. For example, the first pad 105 may have more than four sides, e.g., pentagon, hexagon, octagon shapes.

A portion of a top surface of the first pad 105 may be exposed by a protecting insulating layer provided on the first substrate 100 as illustrated in FIG. 1B. The protecting insulating layer may include a lower insulating layer 101 and an upper insulating layer 111 sequentially stacked on the first substrate 100. The lower insulating layer 101 may be an insulating layer for passivation of the first substrate 100. For example, the lower insulating layer 101 may include at least one of silicon oxide, silicon nitride, or silicon oxynitride. The upper insulating layer 111 may include an organic material such as polyimide or an epoxy resin.

A bump structure BS1 may be provided on the upper insulating layer 111. The bump structure BS1 may include a barrier pattern 121, a seed pattern 126, a metal layer 131, and a solder layer 141 which are sequentially stacked on the upper insulating layer 111. For example, the barrier pattern 121 may include a metal material such as titanium (Ti) and/or titanium-tungsten (TiW). The barrier pattern 121 may prevent the first pad 105 from being oxidized and may increase an adhesive strength between the first pad 105 and the metal layer 131.

The metal layer 131 may be provided on the barrier pattern 121. A thickness of the metal layer 131 may be three or more times greater than a thickness of the barrier pattern 121. In an embodiment, the metal layer 131 may include a different metal material from the barrier pattern 121. For example, the metal layer 131 may include copper (Cu) or aluminum (Al).

The seed pattern 126 may be provided between the barrier pattern 121 and the metal layer 131. The seed pattern 126 may include the same material as the metal layer 131. For example, the seed pattern 126 may include copper (Cu). A thickness of the seed pattern 126 may be equal to or less than one-third (i.e., ⅓) of the thickness of the metal layer 131.

The solder layer 141 may be provided on the metal layer 131 as shown in FIG. 1C. The thickness of the solder layer 141 may not be uniform, e.g., varying along the lengthwise direction on the metal layer 131. The thickness of the solder layer 141 will be later described in more detail.

A metal-solder compound layer 146 may be provided between the metal layer 131 and the solder layer 141. The metal layer 131 may react with the solder layer 141 to form the metal-solder compound layer 146. For example, the metal-solder compound layer 146 may include copper (Cu)-tin (Sn)-silver (Ag) alloy. A thickness of the metal-solder compound layer 146 may be less than about 50% of the thickness of the metal layer 131.

Sidewalls of the patterns 121 and 126 and the layers 131 and 146, which are disposed under the solder layer 141, may have an undercut region UR which is laterally recessed from a sidewall of the solder layer 141. The undercut region UR may be formed by an etching process for the formation of the barrier pattern 121 and the seed pattern 126 in a forming method described later.

The bump structure BS1 may include a body portion (or bonding portion) BP spaced apart from the first pad 105, and a first extension TP extending from a side of the body portion BP onto or toward the first pad 105. A first end portion of the first extension TP is connected to the first pad 105, and a second end portion of the first extension TP is connected to the body portion BP. A width of the first extension TP may be smaller than a width of the body portion BP. In an embodiment, if the first extension TP extends in a first direction (hereinafter, referred to as 'an X-direction), a width W1 of the first extension TP may be smaller than a width W2 of the body portion BP in a second direction (hereinafter, referred to as 'a Y-direction') perpendicular to the X-direction. For example, the width W1 of the first extension TP may have a range of about 10% to about 90% of the width W2 of the body portion BP. Hereinafter, in the present specification, a width and/or a length of the body portion BP, a width and/or a length of the first extension TP, and a width and a length of a second extension SP may be determined on the basis of an outer boundary of the solder layer 141 and/or an outer boundary of the metal layer 131 under of the solder layer 141. Each of the first extension TP, body portion BP, and second extension BP SP can include respective portions of the solder layer 141, metal layer 131, seed pattern 126, and barrier pattern 121.

The bump structure BS1 may further include at least one second extension SP extending from another side of the body portion BP. In an embodiment, three of the second extensions SP may be provided as illustrated in FIG. 1A. However, the inventive concept is not limited thereto. A width W3 of the second extension SP may be smaller than the width W2 of the body portion BP.

In the X-direction, a length E1 of the first extension TP may be greater than a length E2 of the body portion BP. A length E3 of the second extension SP in the X-direction may be smaller than the length E1 of the first extension TP and/or the length E2 of the body portion BP. In an embodiment, the first extension TP, which is relatively longer, may function as a redistribution wire structure. Thus, a portion of the bump structure BS1 may perform the same function as the redistribution wire structure without a formation process of the redistribution wire structure requiring a plurality of processes.

The thickest portion of the solder layer 141 may be positioned in the body portion BP. In other words, a top surface of the body portion BP may be higher than a top surface of the first extension TP and a top surface of the second extension SP. A thickness T2 of the solder layer 141 in the body portion BP may be greater than a thickness T1 of the solder layer 141 in the first extension TP. In an embodiment, the thickness T2 of the solder layer 141 in the body portion BP may be about 1.5 or more times greater than the thickness T1 of the solder layer 141 in the first extension TP. For example, the thickness T2 of the solder layer 141 in the body portion BP may be about 1.5 to about 6.0 times greater than the thickness T1 of the solder layer 141 in the first extension TP. The thickness T2 of the solder layer 141 in the body portion BP may be greater than a thickness T3 of the solder layer 141 in the second extension SP.

The thickness of the solder layer 141 may gradually increase from a location near an end portion of the first extension TP provided on the first pad 105 toward the body portion BP. The thickness of the solder layer 141 may decrease from the body portion BP to an end portion of the second extension SP.

According to an embodiment of the inventive concept, the body portion BP having the increased thickness may correspond to a portion of the bump structure electrically connecting the first substrate 100 to another device, such as another electric element or another substrate. The body portion BP may be horizontally spaced apart from the first pad 105 with the first extension TP arranged therebetween. Thus, the bump structure BS1 may electrically connect the first pad 105 to a pad of another substrate or a terminal of another device without requiring a redistribution structure such as additional wire, layer or pattern on the first substrate 100. Additionally, since the body portion BP is connected to a pad of another substrate, occurring thermal and/or physical stress may be transmitted to the first pad 105 through the first extension TP. In other words, the first extension TP may absorb or buffer the thermal and/or physical stress applied to the first pad 105. If the body portion BP is provided directly on the first pad 105, the first pad 105 may be damaged by the thermal and/or physical stress. However, with the bump structure BS1, damage to the first pad 105 may be substantially reduced.

[Method of Forming Bump Structure]

FIG. 2 is a flowchart illustrating a method of forming a bump structure according to an example embodiment of the inventive concept. FIGS. 3A to 7A are plan views illustrating a method of forming a bump structure according to an example embodiment of the inventive concept. FIGS. 3B to 7B are cross-sectional views illustrating a method of forming a bump structure according to an example embodiment of the inventive concept.

Figure 3A:
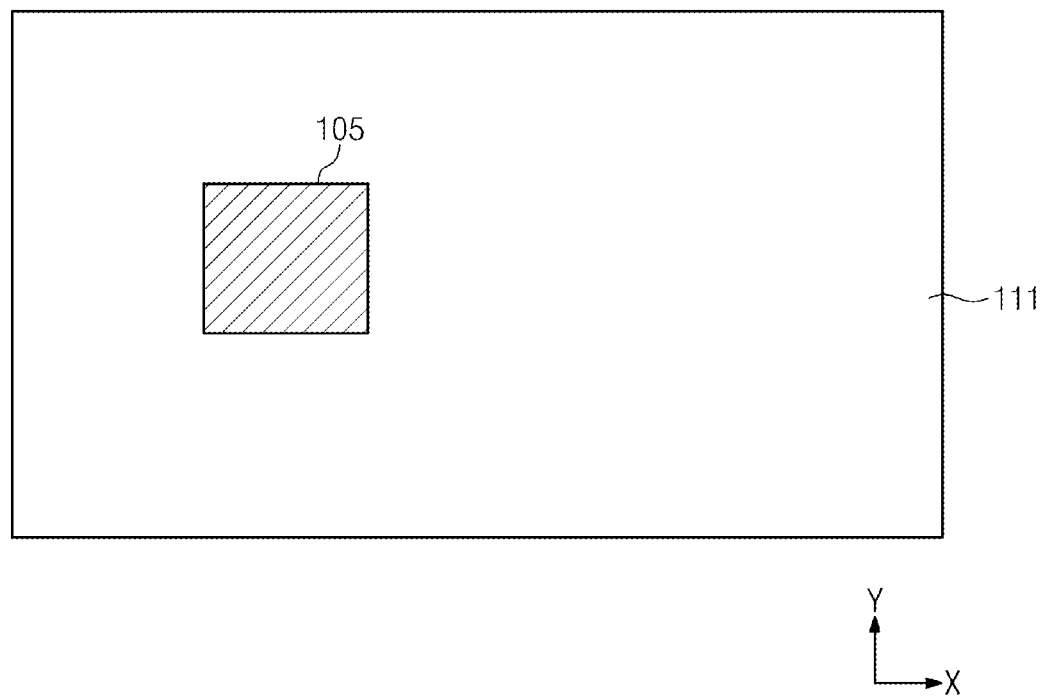
Figure 3B:
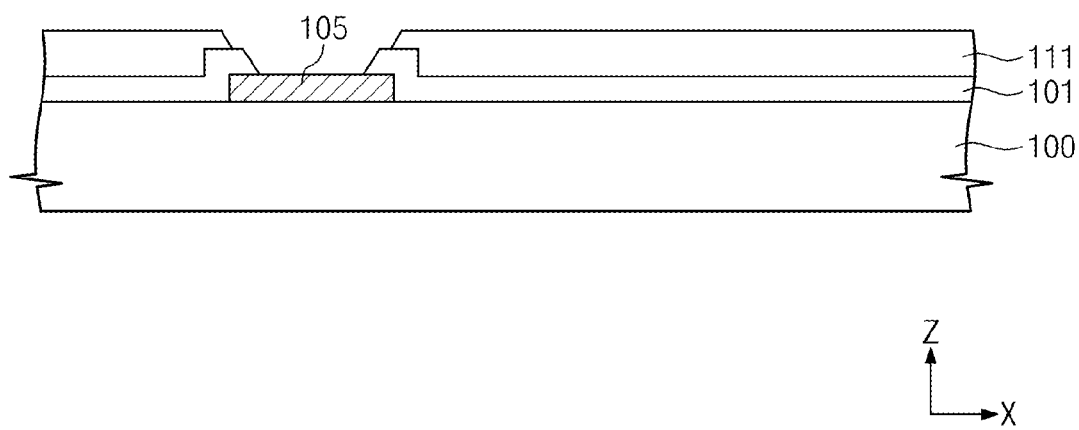

Referring to FIGS. 2, 3A, and 3B, a first pad 105 may be formed on a first substrate 100. The first substrate 100 may include a semiconductor-based structure. For example, the first substrate 100 may include a silicon substrate or a silicon-on-insulator (SOI) substrate. The first substrate 100 may include at least one integrated circuit (not shown). For example, the first substrate 100 may include at least one of a memory device, a system large scale integration (LSI) device such as a micro controller, a logic device, an analog device, a digital signal processor device, or a system on chip (SOC).

In an embodiment, the first pad 105 may be electrically connected to the integrated circuit (not shown) in the first substrate 100. For example, the first pad 105 may include a metal such as aluminum (Al), copper (Cu), silver (Ag), or gold (Au). In an embodiment, a metal layer may be formed by a sputtering method or a chemical vapor deposition (CVD) method, and then the metal layer may be patterned to form the first pad 105.

A protecting insulating layer (or a passivation layer) exposing a top surface of the first pad 105 may be formed on the first substrate 100 (S1). Forming the protecting insulating layer may include sequentially forming a lower insulating layer 101 and an upper insulating layer 111 on the first substrate 100. The lower insulating layer 101 may be an insulating layer for passivation of the first substrate 100. For example, the lower insulating layer 101 may include at least one of silicon oxide, silicon nitride, or silicon oxynitride. The upper insulating layer 111 may include an organic material such as polyimide or an epoxy resin. The lower and upper insulating layers 101 and 111 may be sequentially formed on the first substrate 100 and then may be successively patterned to expose the first pad 105. Alternatively, after the lower insulating layer 101 is formed on the first substrate 100 and then is patterned to expose the first pad 105, the upper insulating layer 101 may be formed on the first substrate 100 having the lower insulating layer 101 and then may be patterned to expose the first pad 105.

Figure 4A:
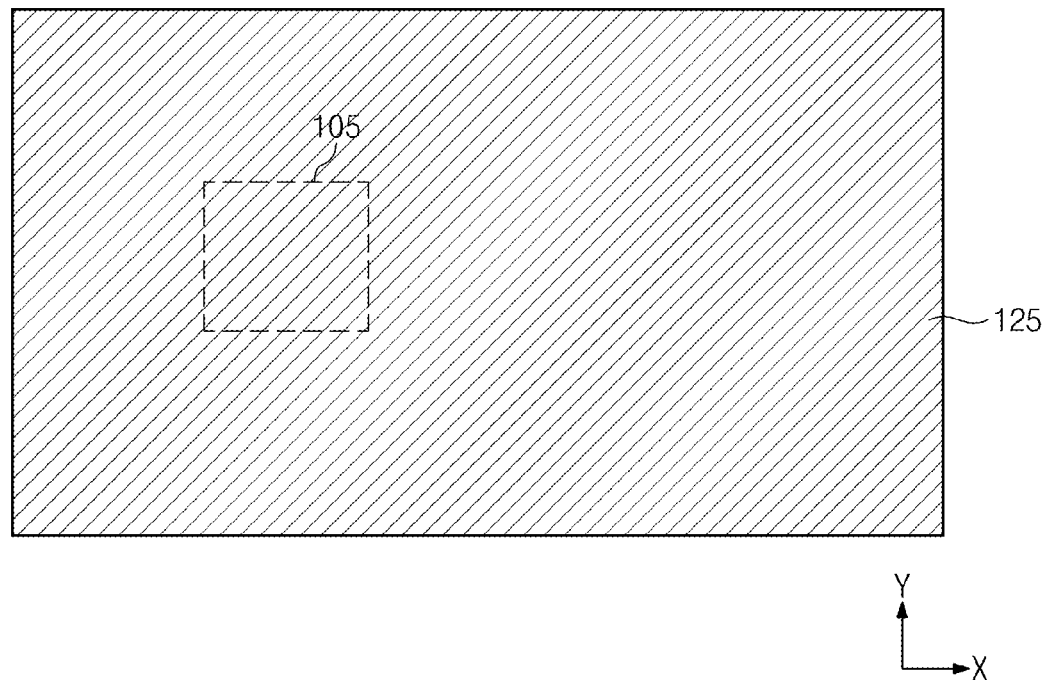
Figure 4B:
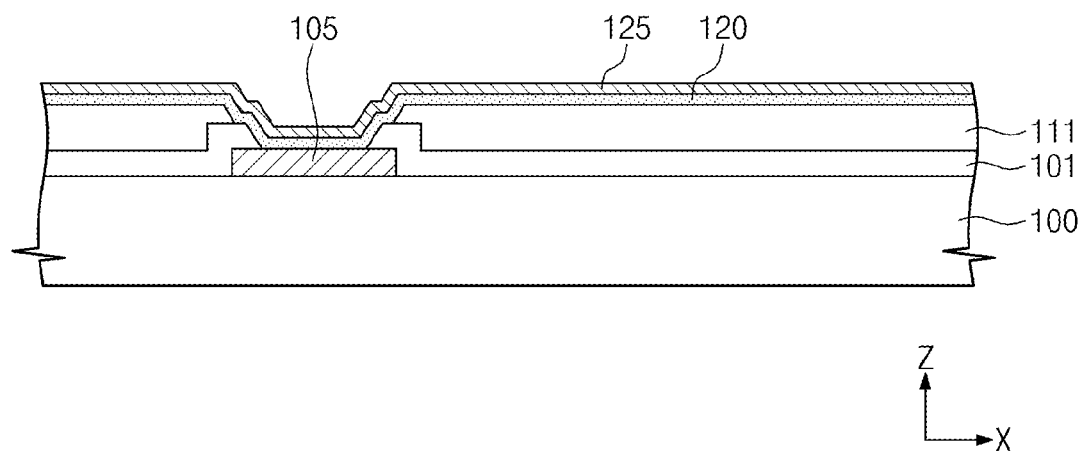

Referring to FIGS. 2, 4A, and 4B, a bather layer 120 and a seed layer 125 may be sequentially formed on the upper insulating layer 111 (S2). The barrier layer 120 may be in contact with the first pad 105 exposed through the upper insulating layer 111. The barrier layer 120 may be formed of a metal material such as titanium (Ti) and/or titanium-tungsten (TiW). For example, the barrier layer 120 may be formed to have a thickness of about 500 Å to about 4000 Å. The barrier layer 120 may be formed by a thin film formation process such as a sputtering method or a physical vapor deposition (PVD) method.

Before the barrier layer 120 is formed, an etching process may be additionally performed for removing a natural oxide layer formed on a surface of the first pad 105. For example, the natural oxide layer may be removed by a dry etching process (e.g., a sputter etching process or a plasma etching process) or a wet etching process.

The seed layer 125 may be formed on the barrier layer 120. The seed layer 125 may be formed of the same material as a metal layer described later. For example, the seed layer 125 may include copper (Cu). The seed layer 125 may be formed to have a thickness of about 1000 Å to about 4000 Å. The seed layer 125 may be formed by a thin film formation process such as a sputtering method or a PVD method.

Figure 5A:
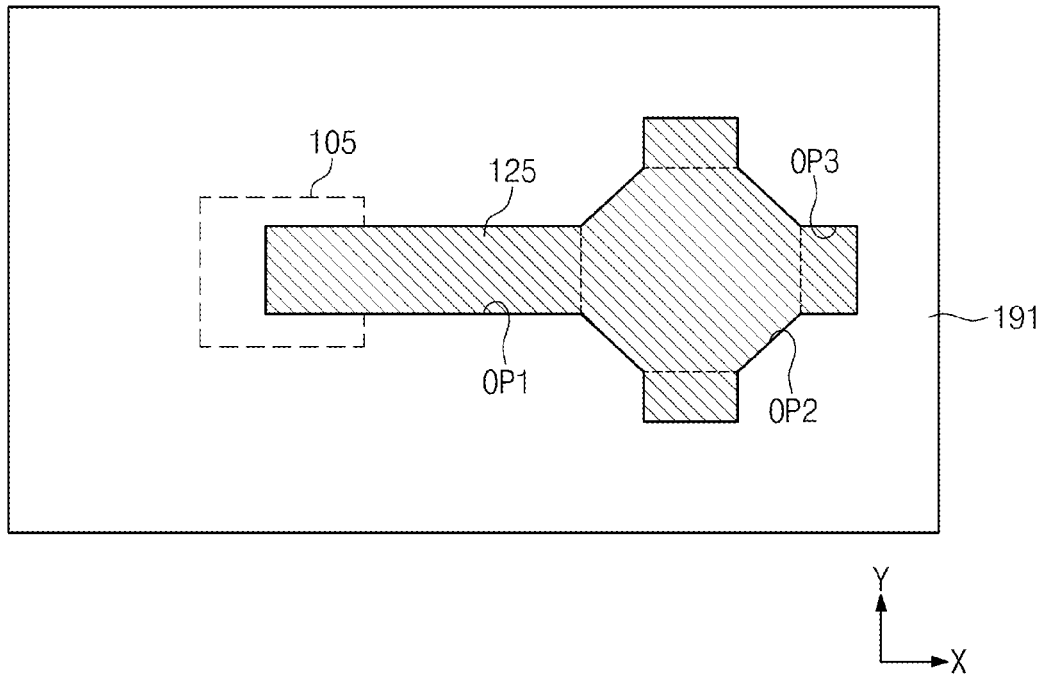
Figure 5B:
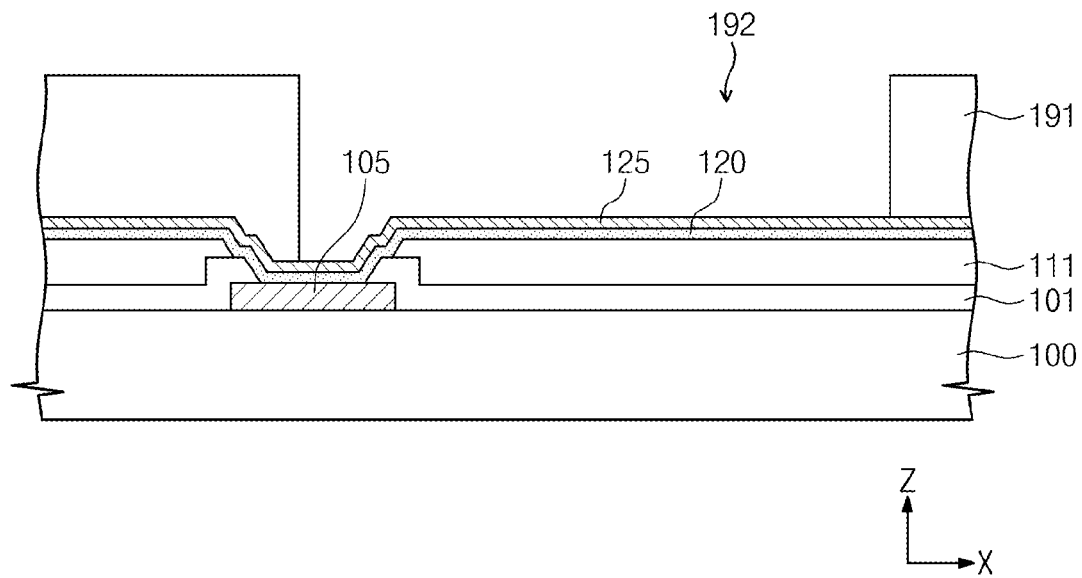

Referring to FIGS. 2, 5A, and 5B, a mold pattern 191 including an opening 192 may be formed on the seed layer 125 (S3). The mold pattern 191 may be a photoresist pattern. For example, a height of the mold pattern 191 may have a range of about 30 μm to about 120 μm.

The opening 192 may vertically overlap at least a portion of the first pad 105. The opening 192 may include a first portion OP1 extending from the first pad 105 in an X-direction, a second portion OP2 connected to the first portion OP1, and a third portion OP3 connected to the second portion OP2. The second portion OP2 has a wider width than the first portion OP1. In some embodiments, a plurality of the third portions OP3 may be connected to the second portion OP2 as illustrated in FIG. 5A.

Referring to FIGS. 2, 6A, and 6B, a metal layer 131 may be formed in the opening 192 (S4). The metal layer 131 may be formed by an electroplating process. For example, the first substrate 100 having the mold pattern 191 may be immersed in a bath to grow the metal layer 131 on the seed layer 120 exposed by the opening 192. The metal layer 131 may be formed to partially fill the opening 192. For example, the metal layer 131 may include copper (Cu). However, the inventive concept is not limited thereto. Since the metal layer 131 is formed using the mold pattern 191, the metal layer 131 may be formed to have a narrow width. Thus, a distance between bump structures, according to the inventive concept, may be smaller than a distance between bumps formed using only a solder layer. As a result, integration degree of a semiconductor device may be improved. A thickness of the metal layer 131 may be three or more times greater than the thickness of the barrier layer 120.

A solder plating layer 140 filling the opening 192 may be formed on the metal layer 131 (S5). The solder plating layer 140 may be formed by an electroplating process. For example, the first substrate 100 having the metal layer 131 may be immersed in another bath and then the electroplating process may be performed to form the solder plating layer 140. The melting temperature of the solder plating layer 140 may be lower than that of the metal layer 131. As illustrated in FIG. 6B, the solder plating layer 140 may have a top surface disposed at substantially the same height as a top surface of the mold pattern 191. However, the inventive concept is not limited thereto. In other embodiments, the top surface of the solder plating layer 140 may be higher or lower than the top surface of the mold pattern 191. For example, the solder plating layer 140 may be formed of a tin (Sn)-silver (Ag) alloy or a lead (Pb)-tin (Sn) alloy. Additionally, the solder plating layer 140 may further include an additive such as copper (Cu), palladium (Pd), bismuth (Bi), and/or antimony (Sb) as the need arises.

Figure 7A:
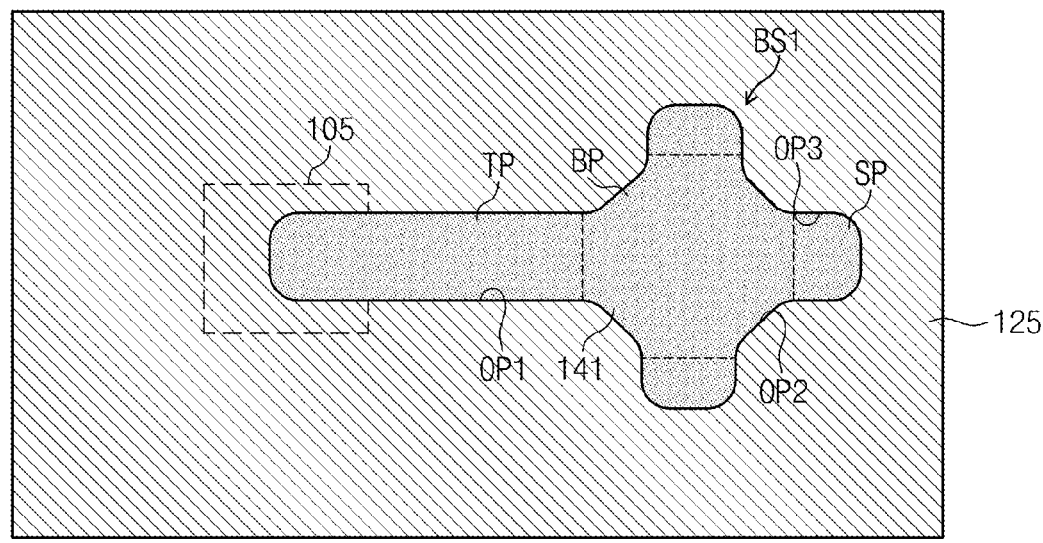
Figure 7B:
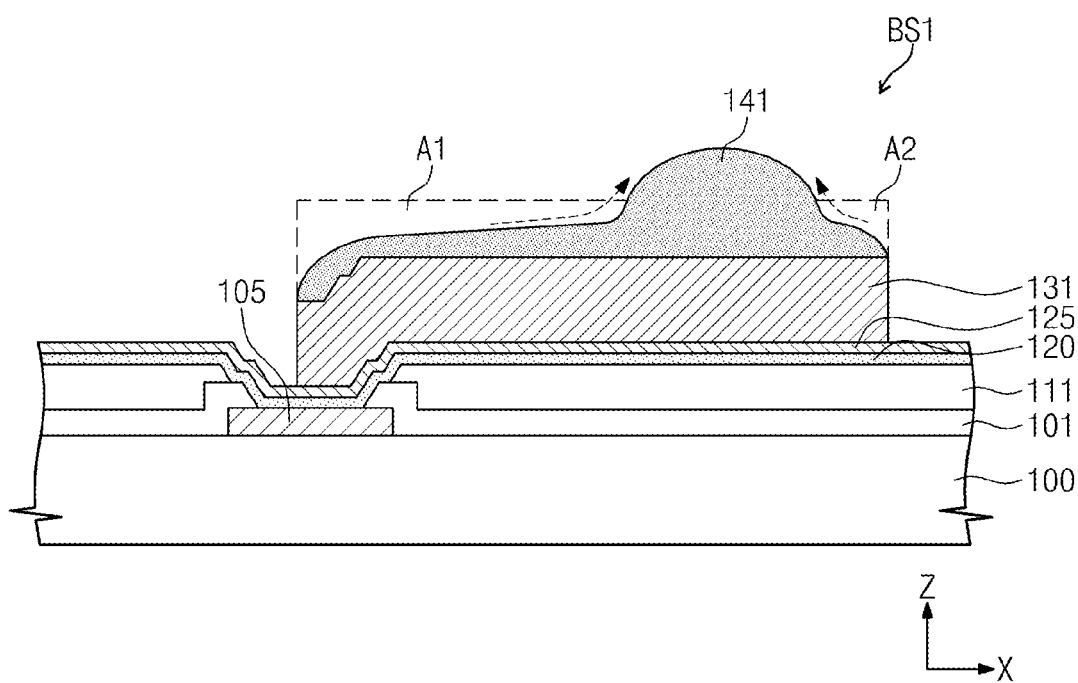

Referring to FIGS. 2, 7A, and 7B, the mold pattern 191 may be removed. For example, the removal of the mold pattern 191 may be performed by an ashing process. After the mold pattern 191 is removed, a natural oxide layer formed on the seed layer 125 may be removed (S6). The natural oxide layer may be removed using a thermal treatment process of a formic acid ($HCO_2H$), a kind of carboxylic acid. For example, formic acid particles in aerosol state may be finely and uniformly distributed in a process chamber in which the first substrate 100 is loaded, and then the thermal treatment process may be performed at a temperature of about 200 degrees Celsius to about 250 degrees Celsius to remove the natural oxide layer.

In a general formation process of a bump, a natural oxide layer may be removed using a liquid flux. The flux may remove the natural oxide layer disposed on the surface of the metal layer 131 and may improve wettability in order that the solder layer 141 covers the surface of the metal layer 131 well. However, if the flux is used, a flux residue may remain on the seed layer 125. Thus, if the seed layer 125 is removed after a reflow process of the solder plating layer 140 is performed, as described later, a portion of the seed layer 125 covered by the flux residue may not be removed by a wet etching process. In an embodiment of the inventive concept, the natural oxide layer may be removed through the thermal treatment process using the formic acid as mentioned above. Thus, an additional cleaning process for removing the flux residue may not be required.

The reflow process of the solder plating layer 140 may be performed to form a reflowed solder layer 141 (S7). As a result, a bump structure BS1 may be formed to include a first extension TP extending from the first pad 105, a body portion BP provided at an end portion of the first extension TP, and a second extension SP extending from the body portion BP. For example, the reflow process may be performed at a temperature of about 200 degrees Celsius to about 300 degrees Celsius. A metal-solder compound layer 146 may be formed between the solder layer 141 and the metal layer 131 as described with reference to FIG. 1C.

Portions A1 and A2 of the solder plating layer 140 before the reflow process, which existed in the first portion OP1 and the second portion OP2 of the opening, respectively, may migrate to the body portion BP (e.g., directions of arrows in FIG. 7B) during the reflow process. In other words, since widths of the first and second extensions TP and SP are smaller than that of the body BP, the reflowed solder material may migrate to the body portion BP by a surface tension. As a result, heights of the first and second extensions TP and SP after the reflow process may be reduced as compared with heights of the first and second extensions TP and SP before the reflow process, and a height of the body portion BP after the reflow process may increase as compared with a height of the body portion BP before the reflow process. The second extension SP may substantially prevent the solder layer 141 in the body portion BP having the increased height from flowing along the sidewalls of the metal layer 131 onto the seed layer 125, such that the solder layer 141 of the body portion BP may have a sufficient thickness.

After the reflow process is performed, a cleaning process may be performed using deionized (DI) water.

Referring to FIGS. 1A, 1B, 1C, and 2 again, the barrier layer 120 and the seed layer 125 may be patterned to form the barrier pattern 121 and the seed pattern 126 (S8). The patterning process of the barrier layer 120 and the seed layer 125 may be performed using the solder layer 141 as an etch mask. For example, the patterning process of the barrier layer 120 and the seed layer 125 may be performed by a wet etching process using an etching solution including hydrogen peroxide ($H_2O_2$). Sidewalls of the layers under the solder layer 141 may be laterally etched to form an undercut region UR during the wet etching process. According to an embodiment of the inventive concept, the patterning process of the barrier layer 120 and the seed layer 125 is performed after the reflow process. Thus, even though the undercut region UR is formed, a wetting angle of the solder layer 141 is not reduced since the reflow of the solder layer 141 is finished. Thus, it is possible to substantially limit the reduction of the wetting angle, which may occur if the reflow process is performed after the patterning process. As a result, the solder layer 141 may be prevented from flowing along the sidewalls of the metal layer 131 by the reduction of the wetting angle.

According to exemplary embodiment of the inventive concept, the bump structure may be formed without additional photolithography processes except for the photolithography process for the formation of the mold pattern 191.

[Modified Examples of Bump Structure]

Figure 8A:
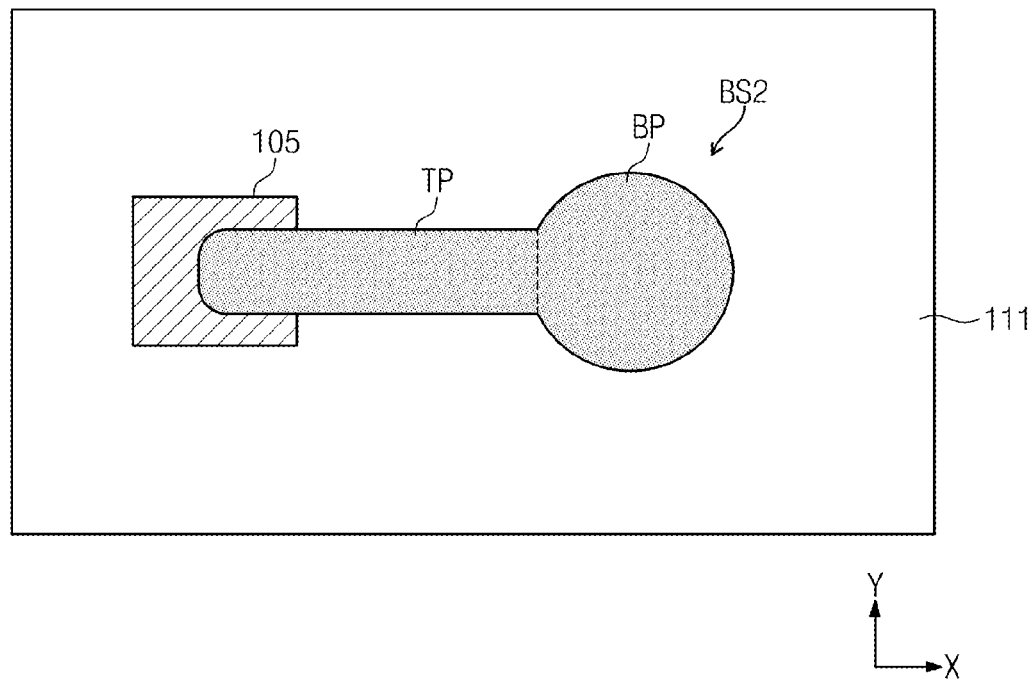
FIGS. 8A, 8B, and 8C are plan views illustrating shapes of second extensions of bump structures according to other embodiments of the inventive concept.
Figure 8B:
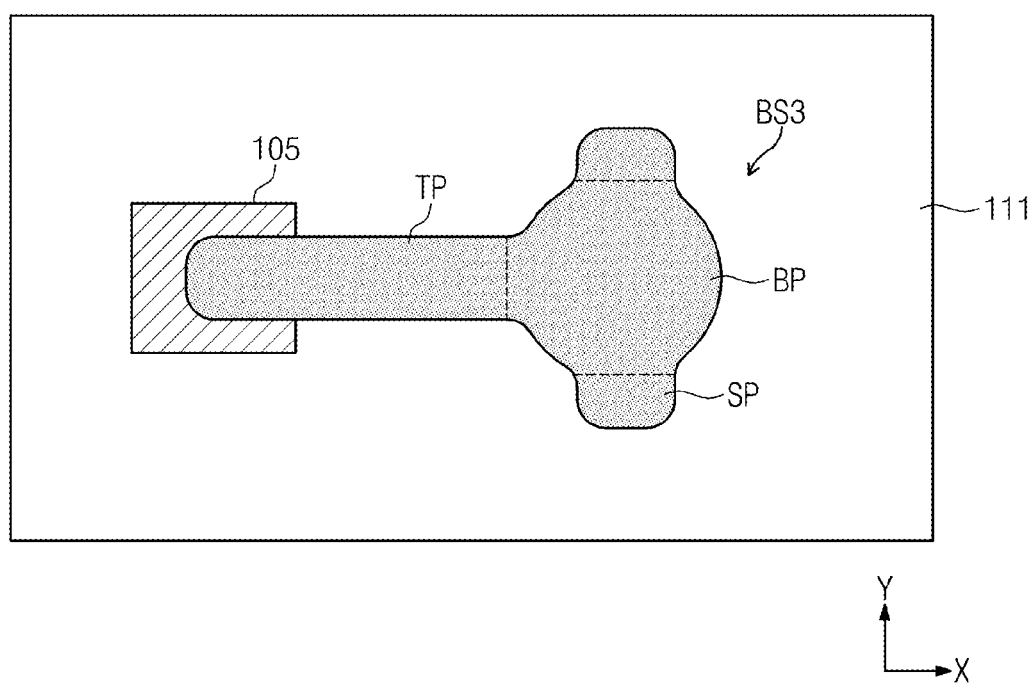
Figure 8C:
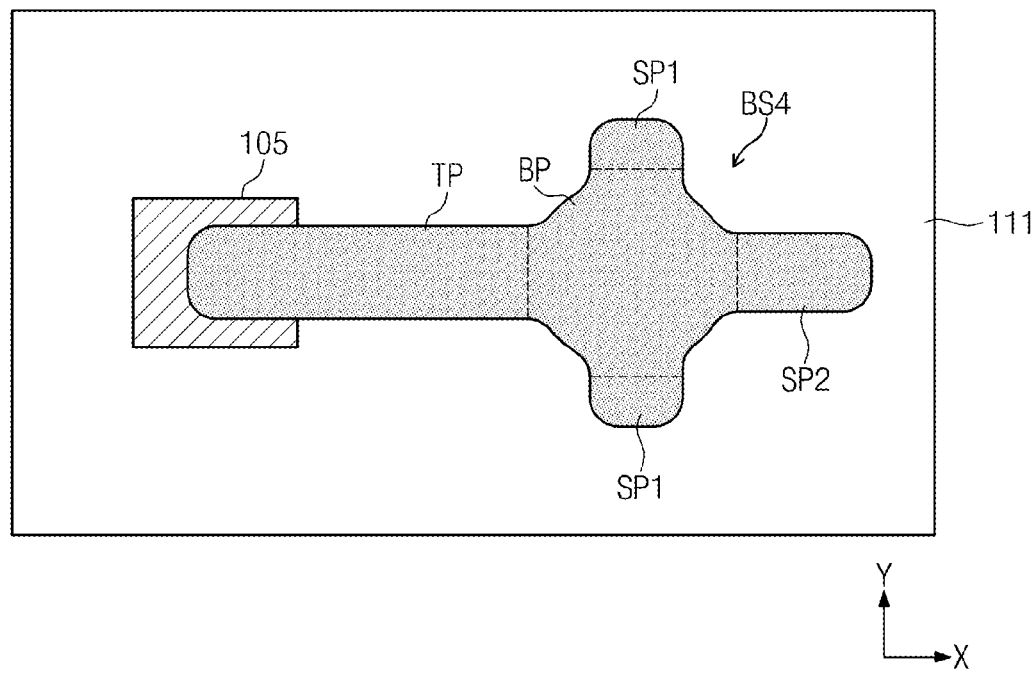

FIGS. 8A, 8B, and 8C are plan views illustrating shapes of second extensions of bump structures according to some other embodiments of the inventive concept. For the purpose of ease and convenience in explanation, the descriptions to the same elements as in the above embodiment will be omitted or mentioned briefly.

Referring to FIG. 8A, a bump structure BS2 according to the present embodiment may include a first extension TP and a body portion BP but may not include a second extension.

Referring to FIG. 8B, a bump structure BS3 according to the present embodiment may include a first extension TP, a body portion BP, and second extensions SP. Unlike as shown in FIG. 1A, the second extensions SP may include two extensions protruding from the body portion BP in the Y-direction but may not include an extension extending in the X-direction.

Referring to FIG. 8C, a bump structure BS4 may include a first extension TP, a body portion BP, and second extensions SP1 and SP2. The second extensions SP1 and SP2 may include extensions SP1 protruding from the body portion BP in the Y-direction and an extension SP2 protruding from the body portion BP in the X-direction. A length of the extension SP2 protruding in the X-direction may be greater than lengths of the extensions SP1 protruding in the Y-direction. Alternatively, the length of each of the extensions SP1 protruding in the Y-direction may be greater than the length of the extension SP2 protruding in the X-direction.

Figure 9A:
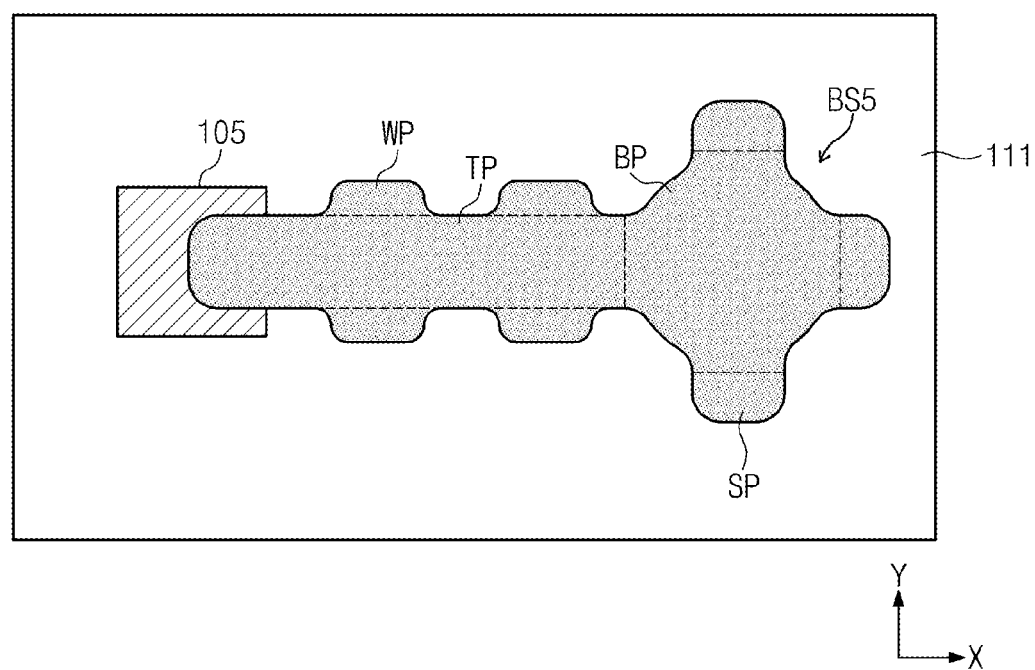
FIGS. 9A, 9B, and 9C are plan views illustrating shapes of first extensions of bump structures according to still other embodiments of the inventive concept.
Figure 9B:
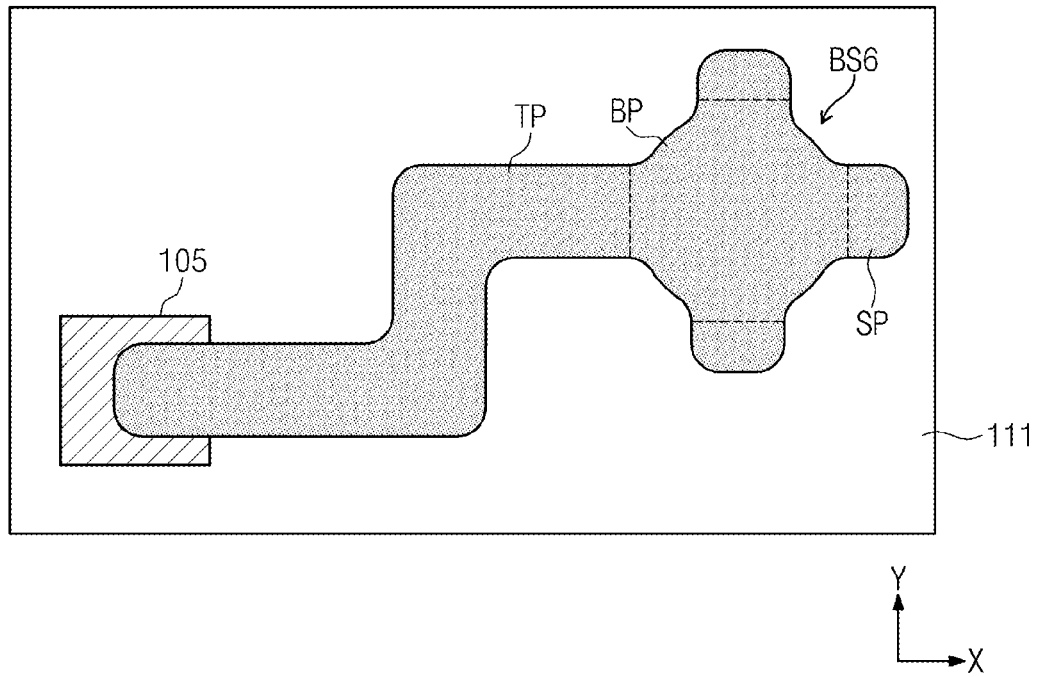
Figure 9C:
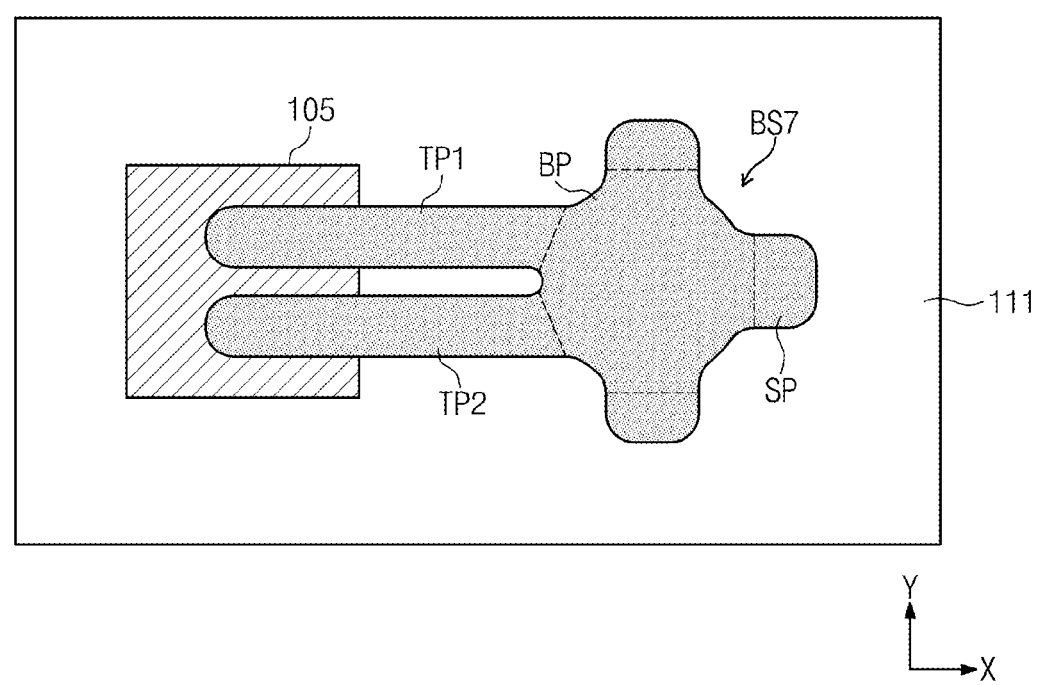

FIGS. 9A, 9B, and 9C are plan views illustrating shapes of first extensions of bump structures according to still other embodiments of the inventive concept. For the purpose of ease and convenience in explanation, the descriptions to the same elements as in the above embodiment will be omitted or mentioned briefly.

Referring to FIG. 9A, a bump structure BS5 may include a first extension TP, a body portion BP, and second extensions SP. The bump structure BS5 may further include third extensions WP protruding from the sidewalls of the first extension TP. A plurality of the third extensions WP may be disposed along both sidewalls of the first extension TP. The third extensions WP may additionally prevent the solder layer 141 from flowing along the sidewalls of the metal layer 131 when the solder layer 141 migrates from the first pad 105 to the body portion BP by the reflow process.

Referring to FIG. 9B, a bump structure BS6 may include a first extension TP, a body portion BP, and second extensions SP. The first extension TP may have a nonlinear shape. In an embodiment, the first extension TP1 may include a portion extending in the X-direction and a portion extending in the Y-direction. The shape of the first extension TP is not limited to the shape illustrated in FIG. 9B. The shape of the first extension TP may be modified depending on an arrangement position of the first pad 105 and/or an arrangement position of a pad of a second substrate mounted on the first substrate 100.

Referring to FIG. 9C, a bump structure BS7 may include multiple first extensions, for example, two first extensions TP1 and TP2, a body portion BP, and second extensions SP. The first extensions TP1 and TP2 may extend onto a single first pad 105 and may be connected to a single body portion BP. Alternatively, the first extensions TP1 and TP2 may extend onto pads different from each other, respectively.

[Semiconductor Package Including Bump Structure]

Figure 10:
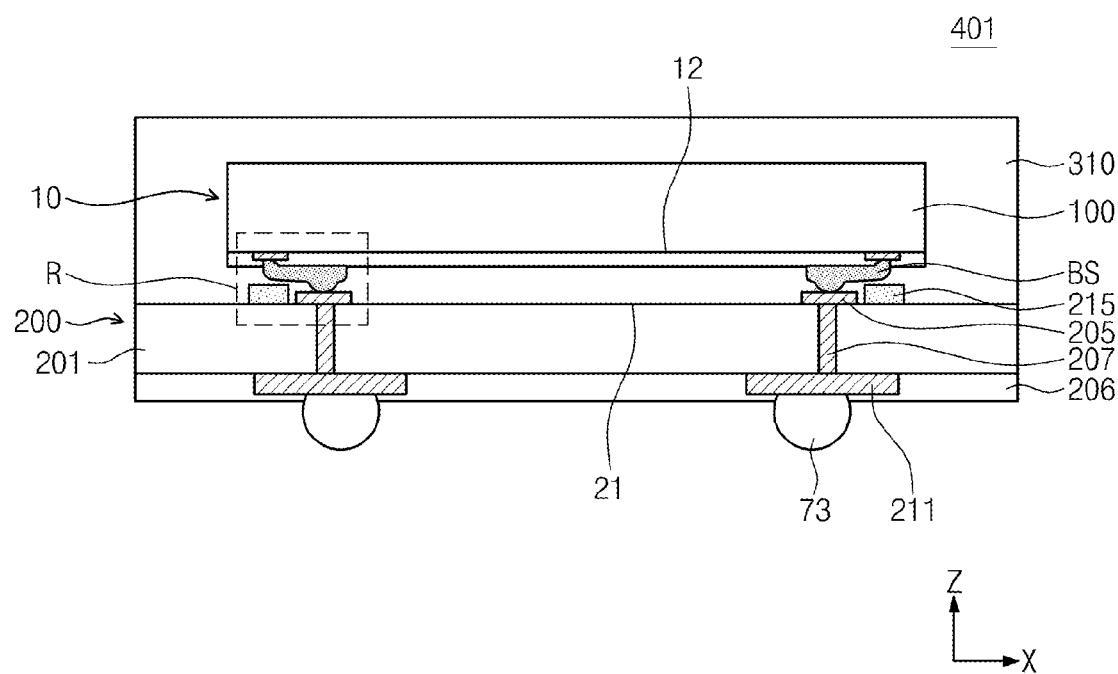
FIG. 10 is a cross-sectional view illustrating a semiconductor package including a bump structure according to an example embodiment of the inventive concept.
Figure 11A:
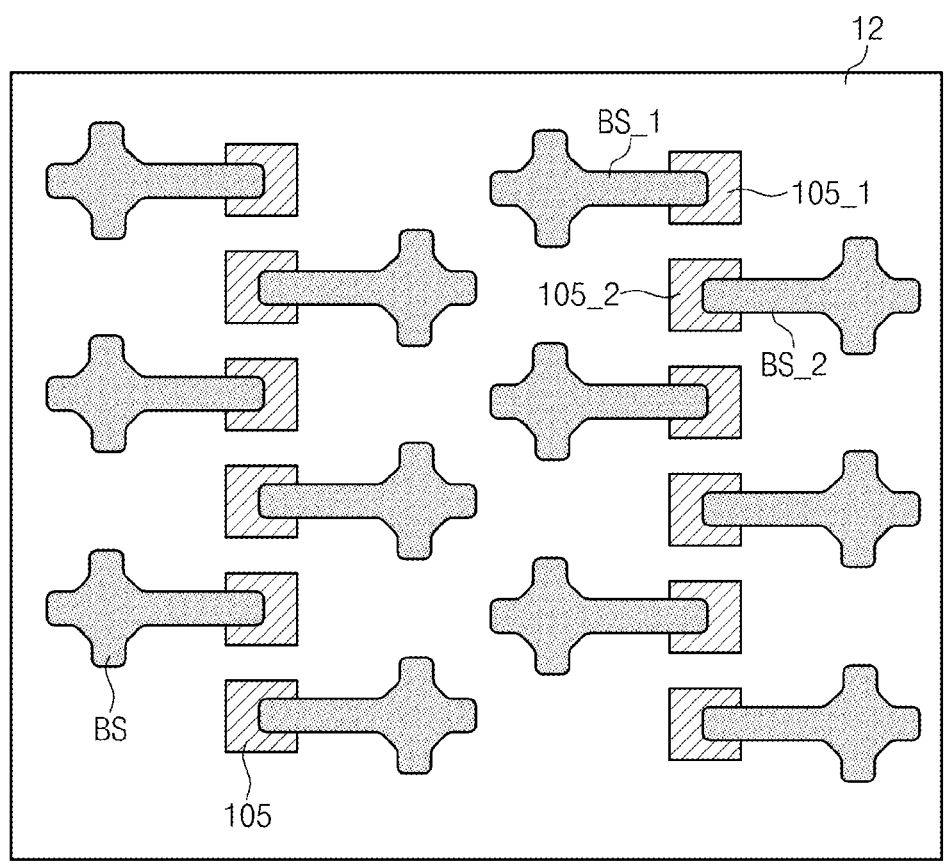
FIG. 11A is a plan view illustrating a top surface of a first substrate.
Figure 11B:
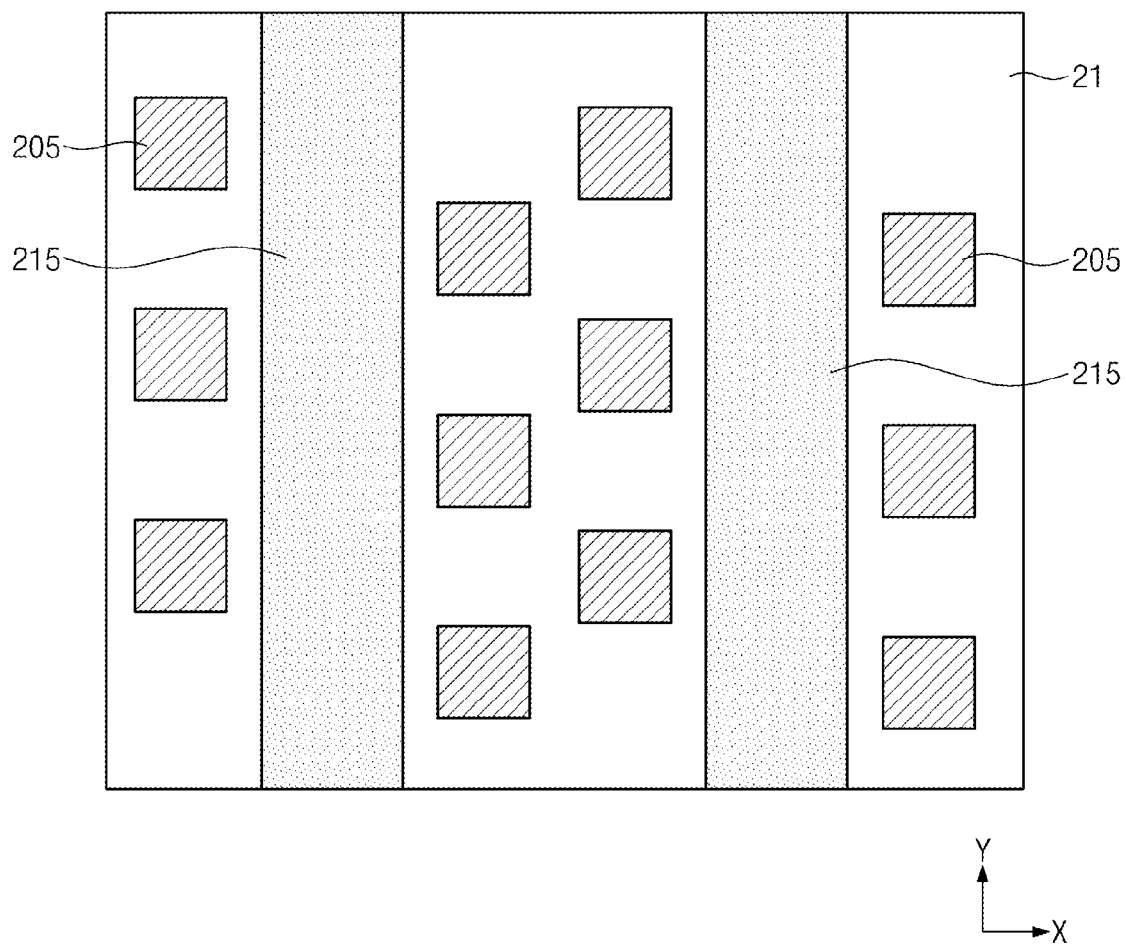
FIG. 11B is a plan view illustrating a top surface of a second substrate.
Figure 11C:
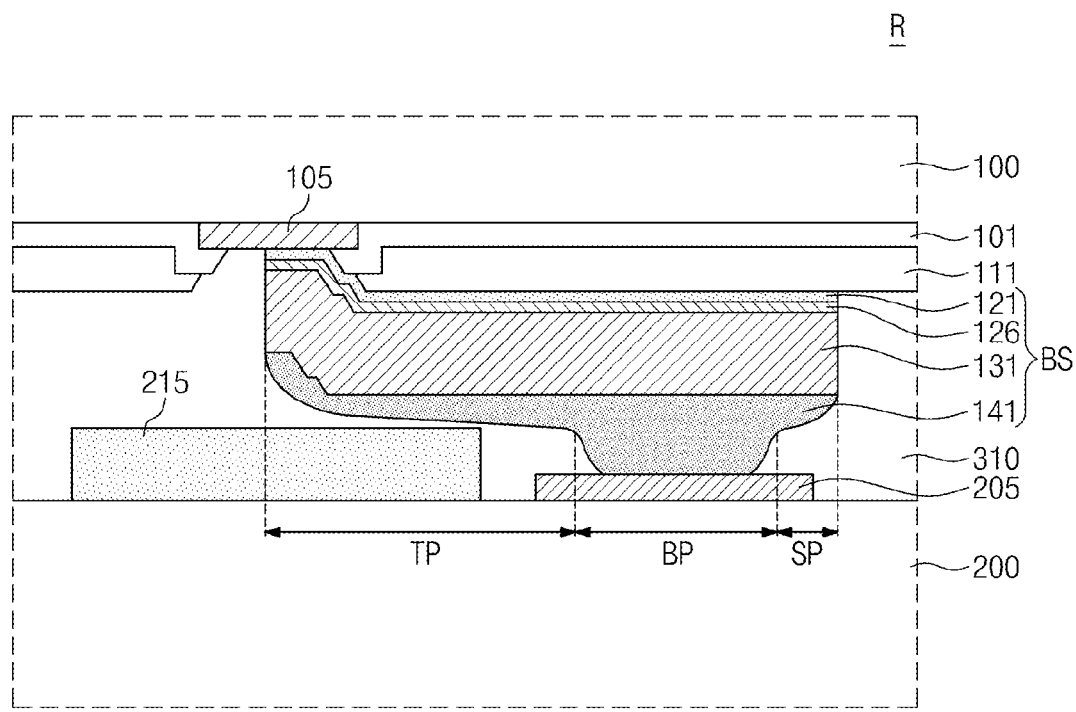
FIG. 11C is an enlarged view of a region 'R' of FIG. 10.

FIG. 10 is a cross-sectional view illustrating a semiconductor package including a bump structure according to an example embodiment of the inventive concept. FIG. 11A is a plan view illustrating a top surface 12 of the first substrate 100, and FIG. 11B is a plan view illustrating a top surface 21 of a second substrate 200. FIG. 11C is an enlarged view of a region 'R' of FIG. 10.

Referring to FIGS. 10, 11A, 11B, and 11C, a semiconductor package 401 may include the second substrate 200 (e.g., a package substrate) and a first semiconductor device 10 mounted on the second substrate 200. The second substrate 200 may be a printed circuit board (PCB). The second substrate 200 may include an insulating substrate 201, through-vias 207 penetrating the insulating substrate 201, second pads 205 disposed on a top surface of the insulating substrate 201, and third pads 211 disposed on a bottom surface of the insulating substrate 201. An insulating layer 206 may cover portions of the third pads 211, and package bumps 73 may be provided on the third pads 211 exposed by the insulating layer 206, respectively. The package bumps 73 may be solder balls, conductive bumps, conductive spacers, a pin grid array, or any combination thereof. Alternatively, the package bumps 73 may be the bump structures according to the above embodiments of the inventive concept.

The first semiconductor device 10 may include the first substrate 100. A plurality of the first pads 105 and a plurality of the bump structures BS may be provided on the top surface 12 of the first substrate 100 in the first semiconductor device 10. The bump structures BS may be arranged in an alternating or zigzag manner with the first pads 105 therebetween. For example, the first pads 105 may be arranged in a Y-direction, and the first pads 105 may include odd-numbered pads 105_1 and even-numbered pads 105_2. Bump structures BS_1 connected to the odd-numbered pads 105_1 may be disposed at a first side of the first pads 105, and bump structures BS_2 connected to the even-numbered pads 105_2 may be disposed at a second side of the first pads 105. The first side and the second side may be regions that are spaced apart from each other along the X-direction, with the first pads 105 arranged therebetween. In an embodiment, the bump structures BS_1 connected to the odd-numbered pads 105_1 may extend in a direction opposite to an extending direction of the bump structures BS_2 connected to the even-numbered pads 105_2. However, the inventive concept is not limited thereto.

According to some embodiments of the inventive concept, the bump structures BS may be arranged in an alternating or zigzag manner, such that a short between adjacent bump structures BS may be prevented even though the distance between the first pads 105 in a Y-direction is reduced. Thus, the distance between the first pads 105 can be substantially reduced, so that the semiconductor device may be more highly integrated. Additionally, shapes of the bump structures BS can be modified depending on the arrangement of the second pads 205, such that the first semiconductor device 10 may be easily mounted on the second substrate 200.

The first semiconductor device 10 may be mounted on the second substrate 200 in such a way that the top surface 12 of the first substrate 100 faces the top surface 21 of the second substrate 200. The body portions BP of the bump structures BS formed on the first semiconductor device 10 may be aligned with the second pads 205. After the first semiconductor device 10 is mounted on the second substrate 200, a molding layer 310 may be formed to cover the first semiconductor device 10. The molding layer 310 may fill a space between the first semiconductor device 10 and the second substrate 200. The molding layer 310 may include an epoxy molding compound.

Insulating patterns 215 extending between the second pads 205 may be provided on the second substrate 200. The insulating patterns 215 may vertically overlap at least portions of the first extensions TP in the bump structures BS when the first semiconductor device 10 is mounted on the second substrate 200. The insulating patterns 215 may prevent the first extensions TP from shorting with other structures of the second substrate 200 except the second pads 205. The insulating patterns 215 may extend in an arranged direction (e.g., the Y-direction) of the first pads 105 and may vertically overlap the first pads 105. For example, the insulating patterns 215 may include silicon oxide, silicon nitride, and/or silicon oxynitride.

[Modified Examples of Semiconductor Package]

Figure 12A:
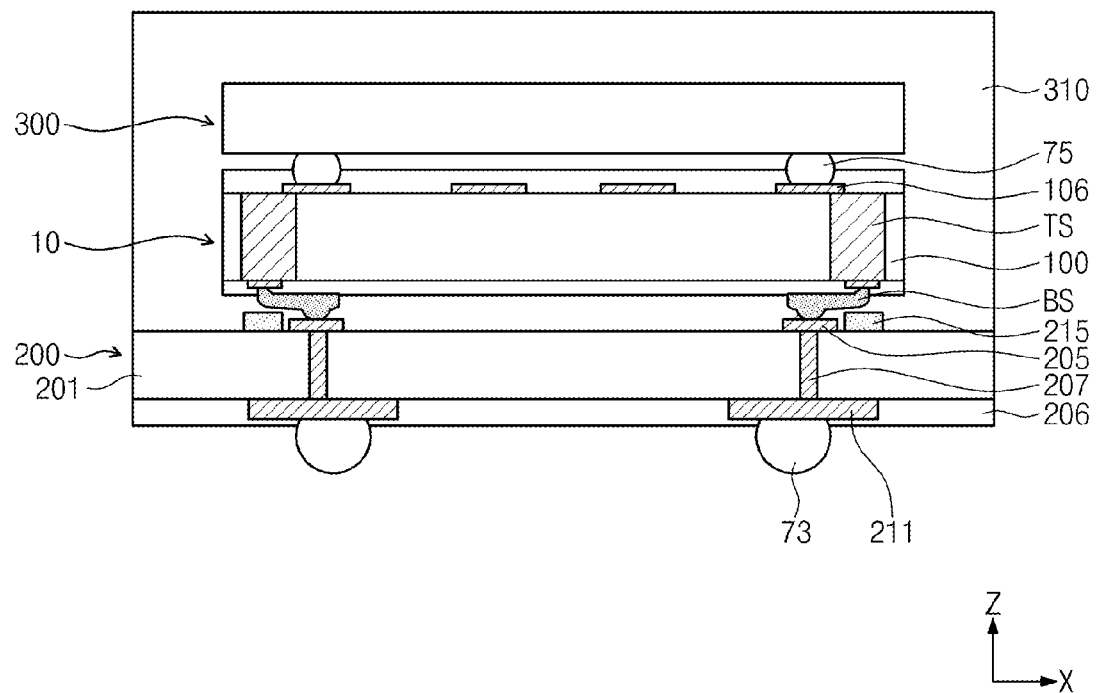
FIGS. 12A and 12B are cross-sectional views illustrating semiconductor packages according to other embodiments of the inventive concept.
Figure 12B:
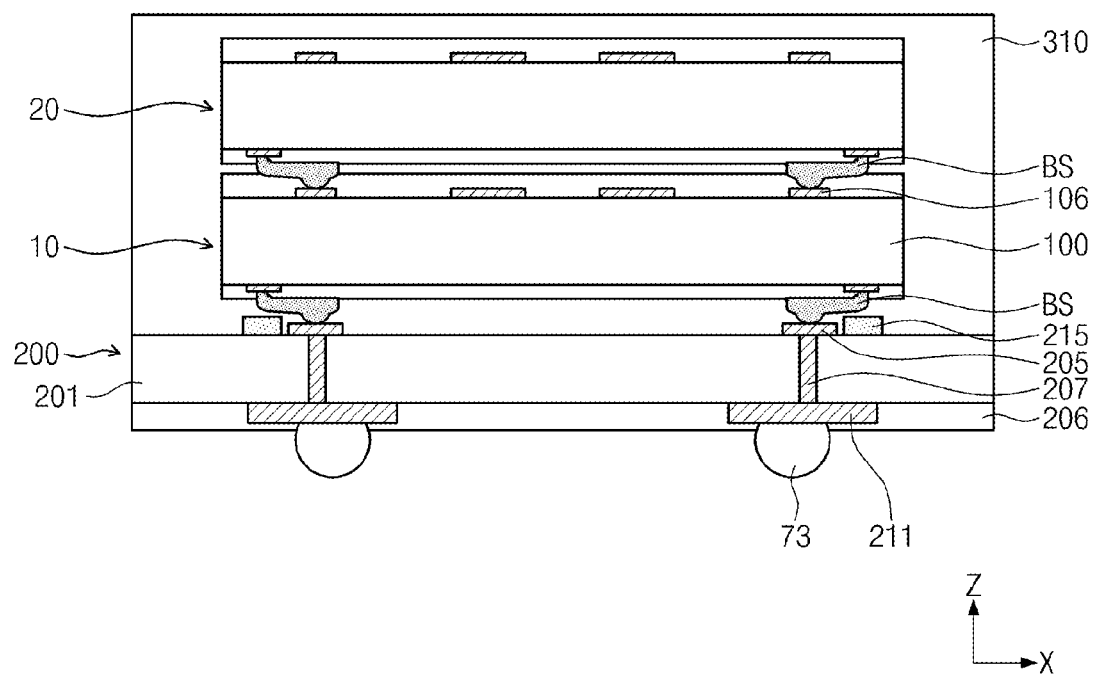

FIGS. 12A and 12B are cross-sectional views illustrating semiconductor packages according to other embodiments of the inventive concept. For the sake of simplicity, the descriptions to the same elements as in the aforementioned embodiment will be omitted or mentioned briefly.

Referring to FIG. 12A, a semiconductor package 402 may include the second substrate 200, a first semiconductor device 10 mounted on the second substrate 200, and a second semiconductor device 300 on the first semiconductor device 10. The first semiconductor device 10 may further include a through-electrode TS, and the bump structure BS may be electrically connected to the through-electrode TS. The second semiconductor device 300 may be another type of a semiconductor device different from the first semiconductor device 10. For example, the second semiconductor device 300 may correspond to a memory chip or a logic chip. The second semiconductor device 300 may not include the bump structure BS according to embodiments of the inventive concept. For example, the second semiconductor device 300 may be connected to fourth pads 106 disposed on the first semiconductor device 10 through conventional solder bumps 75.

Referring to FIG. 12B, a semiconductor package 403 may include the second substrate 200, a first semiconductor device 10 mounted on the second substrate 200, and a third semiconductor device 20 on the first semiconductor device 10. The semiconductor package 403, according to the present embodiment, may be a multi-chip package. The third semiconductor device 20 may be the same kind as the first semiconductor device 10 and/or may have the same structure as the first semiconductor device 10.

Figure 13:
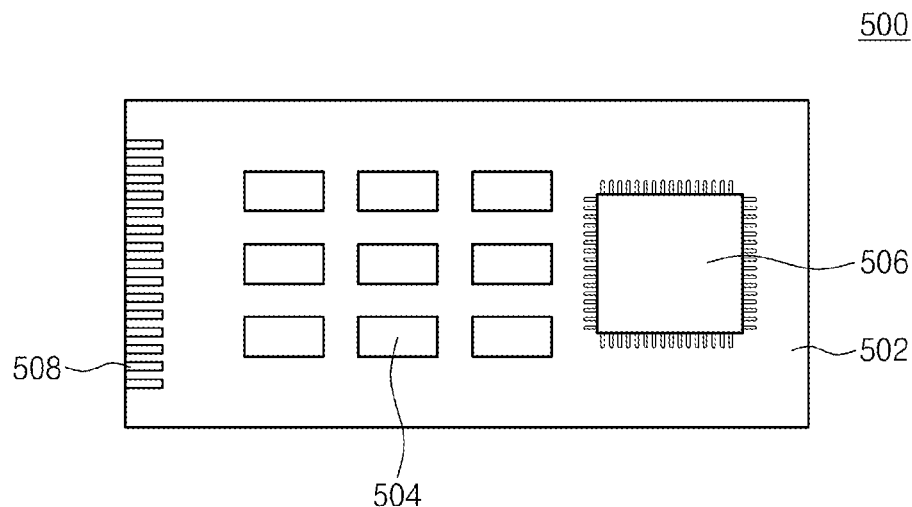
FIG. 13 is a plan view illustrating a package module according to example embodiments of the inventive concept.

FIG. 13 is a plan view illustrating a package module 500 according to example embodiments of the inventive concept. Referring to FIG. 13, the package module 500 may include a module substrate 502 including external connection terminals 508, and a semiconductor chip 504 and a quad flat package (QFP) type semiconductor package 506 mounted on the module substrate 502. The semiconductor chip 504 and/or the semiconductor package 506 may include the semiconductor device according to the aforementioned embodiments of the inventive concept. The package module 500 may be connected to an external electronic device through the external connection terminals 508.

Figure 14:
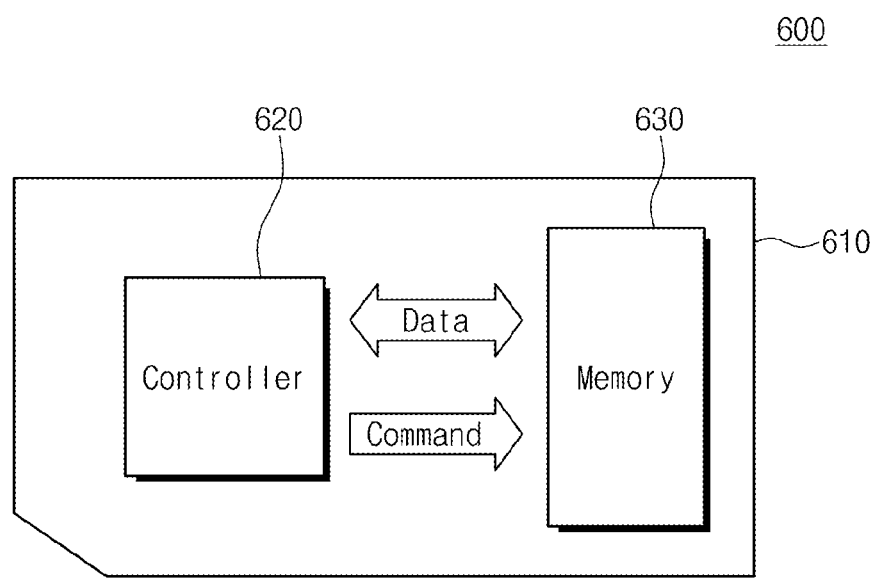
FIG. 14 is a schematic block diagram illustrating a memory card according to example embodiments of the inventive concept.

FIG. 14 is a schematic block diagram illustrating a memory card 600 according to example embodiments of the inventive concept. Referring to FIG. 14, the memory card 600 may include a controller 620 and a memory device 630 in a housing 610. The controller 620 and the memory device 630 may exchange electrical signals with each other. For example, the memory device 630 may exchange data with the controller 620 by command of the controller 620. Thus, the memory card 600 may store the data in the memory device 630 or may output the data stored in the memory device 630 to an external electronic device.

The controller 620 and/or the memory device 630 may include at least one of the semiconductor device or the semiconductor device according to the above embodiments of the inventive concept. The memory card 600 may be used as data storage mediums installed in various portable devices. For example, the memory card 600 may include a multimedia card (MMC) or a secure digital (SD) card.

Figure 15:
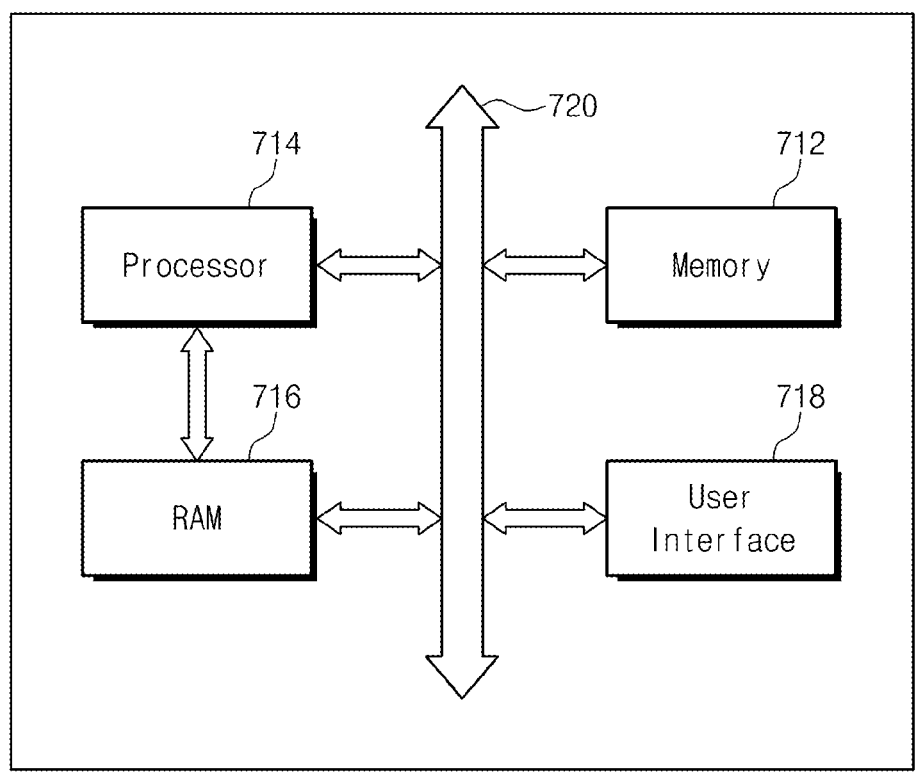
FIG. 15 is a schematic block diagram illustrating an electronic system according to example embodiments of the inventive concept.

FIG. 15 is a schematic block diagram illustrating an electronic system 700 according to example embodiments of the inventive concept. Referring to FIG. 15, the electronic system 700 may include at least one of the semiconductor device or the semiconductor package according to the aforementioned embodiments of the inventive concept. The electronic system 700 may include a mobile device or a computer. For example, the electronic system 700 may include a memory system 712, a processor 714, a RAM device 716, and a user interface unit 718 which communicate with each other through a data bus 720. The processor 714 may execute a program and control the electronic system 700. The RAM device 716 may be used as an operating memory of the processor 714. For example, each of the processor 714 and the RAM device 716 may include the semiconductor device or the semiconductor package according to the above embodiments of the inventive concept. Alternatively, the processor 714 and the RAM device 716 may be included in one package. The user interface unit 718 may be used for data input/output of the electronic system 700. The memory system 712 may store a code for operating the processor 714 and data processed by the processor 714, and/or data inputted from an external electronic device. The memory system 712 may include a controller and a memory device. The memory system 712 may be substantially the same as the memory card 600 illustrated in FIG. 14.

Figure 16:
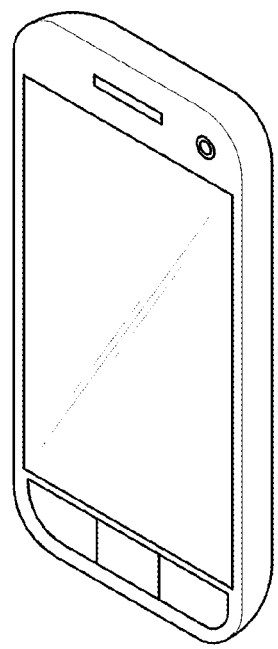
FIG. 16 illustrates a mobile phone applied with an electronic system according to example embodiments of the inventive concept.

The electronic system 700 may be applied to electronic control elements of various electronic devices. FIG. 16 shows a mobile phone 800 applied with the electronic system 700 of FIG. 15. In other embodiments, the electronic system 700 of FIG. 15 may be applied to a portable notebook, a MP3 player, a navigation system, a solid state disk (SSD), a car, and/or household appliances.

According to exemplary embodiments of the inventive concept, the substrates may be electrically connected to each other with ease. Additionally, the reliability of the semiconductor device may be improved. Furthermore, a semiconductor device capable of reducing the distance between the pads may be provided.

While the inventive concept has been described with reference to example embodiments, it will be apparent to those skilled in the art that various changes and modifications may be made without departing from the spirit and scope of the inventive concept. Therefore, it should be understood that the above embodiments are not limiting, but illustrative. Thus, the scope of the inventive concept is to be determined by the broadest permissible interpretation of the following claims and their equivalents, and shall not be restricted or limited by the foregoing description.

What is claimed is:

1. A bump structure comprising:
a body portion provided on a substrate and spaced apart from a pad disposed on the substrate;
a first extension extending in a first direction from the body portion toward the pad; and
a second extension extending in a second direction from the body portion, the second direction opposite to or crossing the first direction,
wherein a width of the first extension is smaller than a width of the body portion, wherein the bump structure includes a barrier layer, a metal layer, and a solder layer sequentially stacked on the substrate; and wherein a portion of the solder layer in the body portion is thicker than another portion of the solder layer in the first extension, wherein the first extension covers at least a portion of an upper surface of the pad, and wherein a thickness of the solder layer gradually increases from an end portion of the first extension provided on the pad toward the body portion.

2. The bump structure of claim 1, wherein the thickness of the solder layer decreases from the body portion toward an end portion of the second extension.

3. The bump structure of claim 1, wherein the thickest portion of the solder layer is provided in the body portion.

4. The bump structure of claim 1, wherein a length of the second extension is smaller than a length of the first extension.

5. The bump structure of claim 1, wherein a width of the first extension has a range of about 10% to about 90% of a width of the body portion.

6. The bump structure of claim 1, wherein a length of the first extension is greater than a length of the body portion.

7. The bump structure of claim 1, wherein the second extension includes a plurality of second extensions; and
wherein at least one of the plurality of second extensions has a length different from a length of another of plurality of second extensions.

8. The bump structure of claim 1, wherein the bump structure further comprises:
third extensions extending from the first extension, wherein each third extension extends from the first extension in a direction crossing the first direction.

9. The bump structure of claim 8, wherein the third extensions are provided on both sides of the first extension.

10. A bump structure comprising:
a body portion provided on a substrate and spaced apart from a pad disposed on the substrate;
a first extension extending from a side of the body portion to the pad, the first extension vertically overlaps at least a portion of the pad;
a second extension extending from the first extension; and
wherein the body portion and the first extension include a barrier layer, a metal layer, and a solder layer which are sequentially stacked on the substrate;
wherein a thickness of the metal layer is three or more times greater than a thickness of the barrier layer; and
wherein a top surface of the body portion is higher than a top surface of the first extension; and
wherein the first extension extends in a first direction, wherein the second extension extends from the first extension in a direction crossing the first direction.

11. The bump structure of claim 10, wherein the first extension extends in a first direction; and
wherein a width of the first extension is smaller than a width of the body portion in a the second direction perpendicular to the first direction in plan view, wherein the second direction is perpendicular to the first direction.

12. The bump structure of claim 11, wherein the width of the first extension has a range of about 10% to about 90% of the width of the body portion.

13. The bump structure of claim 11, wherein a length of the first extension is greater than a length of the body portion.

14. The bump structure of claim 10, wherein a thickness of the solder layer in the body portion is greater than a thickness of the solder layer in the first extension.

15. The bump structure of claim 14, wherein the thickness of the solder layer in the body portion is about 1.5 or more times greater than the thickness of the solder layer in the first extension.

16. The bump structure of claim 14, wherein the thickness of the solder layer increases along the first extension to the body portion.

17. The bump structure of claim 10, further comprising:
a metal-solder compound layer disposed between the metal layer and the solder layer.

18. The bump structure of claim 10, further comprising:
a protecting insulating layer disposed between the substrate and the barrier layer, the protecting insulating layer exposing a top surface of the pad.

19. The bump structure of claim 10, wherein a sidewall of the metal layer and a sidewall of the barrier layer include an undercut region laterally recessed from an outer boundary of the solder layer.

20. The bump structure of claim 10, further comprising:
a third extension extending from another side of the body portion, wherein the top surface of the body portion is higher than a top surface of the second extension.

21. The bump structure of claim 20, wherein the third extension is shorter in length than the first extension.

22. An electrical connection structure comprising:
first pads disposed on a first substrate;
bump structures connected to the first pads; and
second pads disposed on a second substrate, the second pads electrically connected to the first pads through the bump structures,
wherein each of the bump structures comprises:
a body portion laterally spaced apart from one of the first pads and connected to one of the second pads;
a first extension extending in a first direction from the body portion to one of the first pads; and
a second extension extending in a second direction from the body portion,
wherein the body portion is thicker than the first extension,
wherein the second extension includes:
a first portion extending in a second direction opposite to the first direction; and
second portion extending in a third direction crossing the first and second directions.

23. The electrical connection structure of claim 22, wherein each of the bump structures includes a barrier layer, a metal layer, and a solder layer sequentially stacked on the first substrate; and
wherein the thickest portion of the solder layer is disposed in the body portion.

24. The electrical connection structure of claim 23, wherein the solder layer in the first extension becomes thicker toward the body portion.

25. The electrical connection structure of claim 22, wherein a width of the first extension is smaller than a width of the body portion in a direction perpendicular to the first direction in plan view.

26. The electrical connection structure of claim 25, wherein the width of the first extension has a range of about 10% to about 90% of the width of the body portion.

27. The electrical connection structure of claim 22, wherein
the first pads are arranged along the first substrate in the first direction in plan view;
wherein the bump structures comprise a first group of bump structures and a second group of bump structures, wherein said first group of bump structures is connected to odd-numbered ones of the first pads, and wherein said second group of bump structures is connected to even-numbered ones of the first pads, respectively;
wherein each bump structure in said first group of bump structures extends along the second direction in plan view and is disposed on a first side of the first pads; and
wherein each bump structure in the second group of bump structures extends along the second direction and is disposed on an opposite side of the first pads.

28. The electrical connection structure of claim 27, further comprising:
an insulating pattern disposed on the second substrate and vertically overlapping the first extension.

29. The electrical connection structure of claim 28, wherein the insulating pattern extends in the first direction.

30. The electrical connection structure of claim 22, wherein the body portion of each of the bump structures is aligned with each of the second pads.

31. The electrical connection structure of claim 22, wherein the third direction is perpendicular to the first and second directions.

* * * * *